United States Patent
Ko et al.

(10) Patent No.: US 11,978,770 B2
(45) Date of Patent: May 7, 2024

(54) SEMICONDUCTOR DEVICE

(71) Applicant: SAMSUNG ELECTRONICS CO., LTD., Suwon-si (KR)

(72) Inventors: Myung-Dong Ko, Hwaseong-si (KR); Woo Cheol Shin, Seoul (KR); Soo Jin Jeong, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 344 days.

(21) Appl. No.: 17/388,225

(22) Filed: Jul. 29, 2021

(65) Prior Publication Data

US 2022/0208967 A1 Jun. 30, 2022

(30) Foreign Application Priority Data

Dec. 24, 2020 (KR) .................. 10-2020-0182782

(51) Int. Cl.
*H01L 29/06* (2006.01)
*H01L 29/08* (2006.01)
*H01L 29/66* (2006.01)

(52) U.S. Cl.
CPC ...... *H01L 29/0673* (2013.01); *H01L 29/0847* (2013.01); *H01L 29/66553* (2013.01)

(58) Field of Classification Search
CPC ............ H01L 29/0673; H01L 29/0847; H01L 29/66553; H01L 29/42392; H01L 21/823425; H01L 21/823468; H01L 21/823864; H01L 27/092; H01L 27/088; H01L 29/41725
See application file for complete search history.

(56) References Cited

U.S. PATENT DOCUMENTS

| | | |
|---|---|---|
| 10,170,638 B1 | 1/2019 | Reznicek |
| 10,181,510 B2 | 1/2019 | Yang et al. |
| 10,361,268 B2 | 7/2019 | Wostyn et al. |
| 10,424,651 B2 | 9/2019 | Cheng et al. |
| 10,566,445 B2 | 2/2020 | Bi et al. |
| 10,629,740 B2 | 4/2020 | Yang et al. |
| 10,658,461 B2 | 5/2020 | Chang et al. |
| 10,714,592 B2 | 7/2020 | Cheng et al. |
| 2017/0256609 A1* | 9/2017 | Bhuwalka ......... H01L 29/78696 |
| 2019/0237559 A1* | 8/2019 | Cheng ................ H01L 29/0653 |
| 2020/0075716 A1 | 3/2020 | Wang et al. |
| 2020/0098860 A1 | 3/2020 | Cheng et al. |
| 2020/0111886 A1 | 4/2020 | Ando et al. |
| 2021/0098627 A1* | 4/2021 | Liaw .................... H01L 29/775 |
| 2022/0149176 A1* | 5/2022 | More ............... H01L 29/78696 |

* cited by examiner

*Primary Examiner* — Changhyun Yi
(74) *Attorney, Agent, or Firm* — Fish & Richardson P.C.

(57) ABSTRACT

A semiconductor device includes a substrate, an active pattern extending in a first direction on the substrate, first and second nanosheets stacked on the active pattern to be spaced apart from each other in a vertical direction, a gate electrode that extends in a second direction the active pattern, the gate electrode surrounding each of the first and second nanosheets, a source/drain region on at least one side of the gate electrode, and inner spacers between the gate electrode and the source/drain region, the inner spacers including a first inner spacer between the active pattern and the first nanosheet, and a second inner spacer between the first nanosheet and the second nanosheet, the second inner spacer having a first portion adjacent to the first nanosheet, and a second portion adjacent to the second nanosheet, the first portion being wider than the second portion.

20 Claims, 25 Drawing Sheets

SEMICONDUCTOR DEVICE

CROSS-REFERENCE TO RELATED APPLICATION

Korean Patent Application No. 10-2020-0182782, filed on Dec. 24, 2020, in the Korean Intellectual Property Office, and entitled: "Semiconductor Device," is incorporated by reference herein in its entirety.

BACKGROUND

1. Field

The present disclosure relates to a semiconductor device, and more specifically, to a semiconductor device including a Multi-Bridge Channel Field Effect Transistor (MBCFET™).

2. Description of the Related Art

As one of scaling technologies for increasing the density of semiconductor devices, a multi-gate transistor with a fin-shaped or nanowire-shaped silicon body is formed on a substrate, and a gate is formed on a surface of the silicon body. Since such a multi-gate transistor utilizes three-dimensional channels, scaling is easily performed. Further, even when a gate length of the multi-gate transistor is not increased, the current control capability may be improved. Furthermore, a short channel effect (SCE), in which potential of a channel region is influenced by a drain voltage, may be effectively suppressed.

SUMMARY

According to an exemplary embodiment of the present disclosure, there is provided a semiconductor device, including a substrate, an active pattern extending in a first direction on the substrate, first and second nanosheets stacked on the active pattern to be spaced apart from each other in a vertical direction, a gate electrode that extends in a second direction different from the first direction on the active pattern and surrounds each of the first and second nanosheets, a source/drain region disposed on at least one side of the gate electrode, and a plurality of inner spacers which is disposed between the gate electrode and the source/drain region, and includes a first inner spacer disposed between the active pattern and the first nanosheet, and a second inner spacer disposed between the first nanosheet and the second nanosheet, wherein the second inner spacer includes a first portion adjacent to the first nanosheet and a second portion adjacent to the second nanosheet, and wherein a width of the first portion of the second inner spacer in the first direction is greater than a width of the second portion of the second inner spacer in the first direction.

According to an exemplary embodiment of the present disclosure, there is provided a semiconductor device, including a substrate, an active pattern extending in a first direction on the substrate, a plurality of nanosheets stacked on the active pattern to be spaced apart from each other in a vertical direction, a gate electrode which extends in a second direction different from the first direction on the active pattern and surrounds each of the plurality of nanosheets, a source/drain region disposed on at least one side of the gate electrode, a plurality of inner spacers which are disposed between the gate electrode and the source/drain region and extend into the source/drain region, and a source/drain contact which is disposed on the source/drain region, extends into the source/drain region, and overlaps an uppermost inner spacer disposed at an uppermost part of the plurality of inner spacers in the first direction, wherein the uppermost inner spacer includes a first portion, and a second portion disposed on an upper surface of the first portion, and wherein a first pitch in the first direction between the first portion of the uppermost inner spacer and the source/drain contact is smaller than a second pitch in the first direction between the second portion of the uppermost inner spacer and the source/drain contact.

According to an exemplary embodiment of the present disclosure, there is provided a semiconductor device, including a substrate in which a NMOS region and a PMOS region are defined, a first plurality of nanosheets which extend in a first direction on the NMOS region of the substrate and are stacked to be spaced apart from each other in a vertical direction, a second plurality of nanosheets which extend in the first direction on the PMOS region of the substrate and are stacked to be spaced apart from each other in the vertical direction, a first gate electrode which extends in a second direction different from the first direction on the NMOS region of the substrate and surrounds each of the first plurality of nanosheets, a second gate electrode which extends in the second direction on the PMOS region of the substrate and surrounds each of the second plurality of nanosheets, a first source/drain region disposed on at least one side of the first gate electrode, a second source/drain region disposed on at least one side of the second gate electrode, and a first plurality of inner spacers which are disposed between the first gate electrode and the first source/drain region and extend into the first source/drain region, wherein a first uppermost inner spacer disposed on an uppermost part of the first plurality of inner spacers includes a first portion, and a second portion disposed on an upper surface of the first portion, and wherein a width of the first portion of the first uppermost inner spacer in the first direction is greater than a width of the second portion of the first uppermost inner spacer in the first direction.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
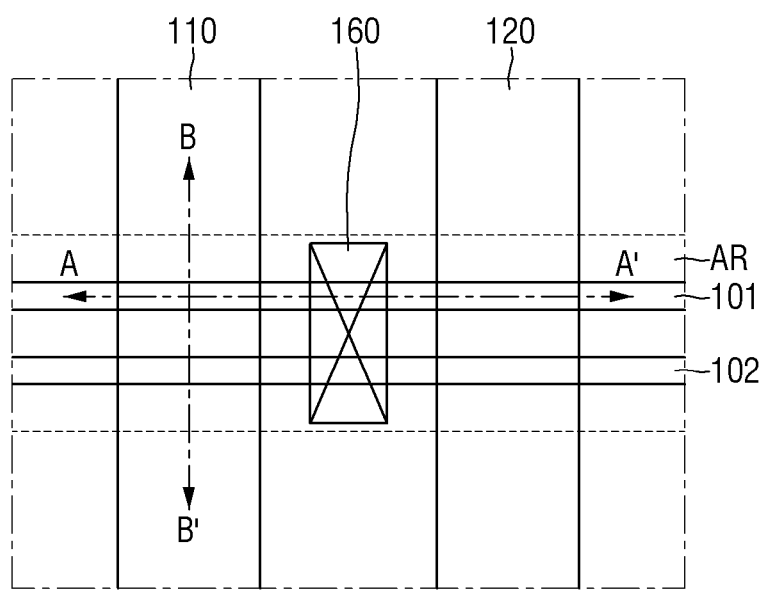
FIG. 1 is a layout diagram of a semiconductor device according to some embodiments.
Figure 1:
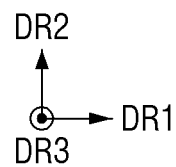
Figure 2:
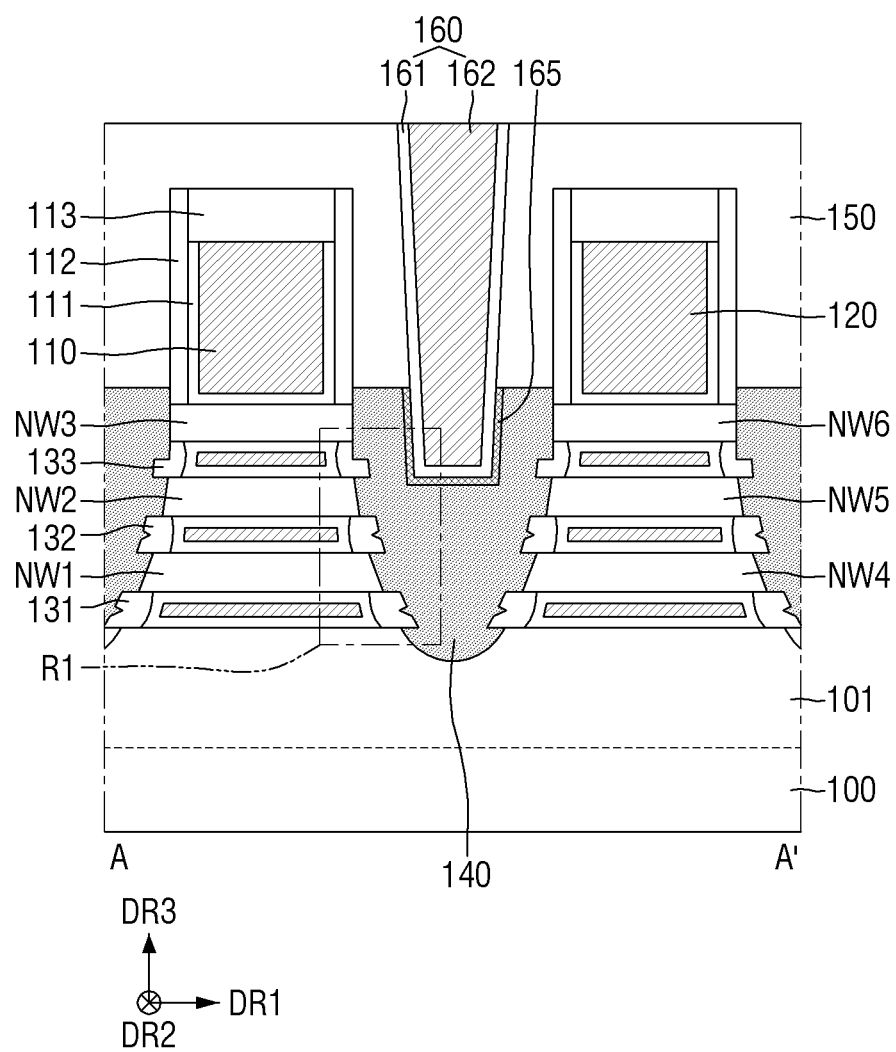
FIG. 2 is a cross-sectional view along line A-A' of FIG. 1.
Figure 3:
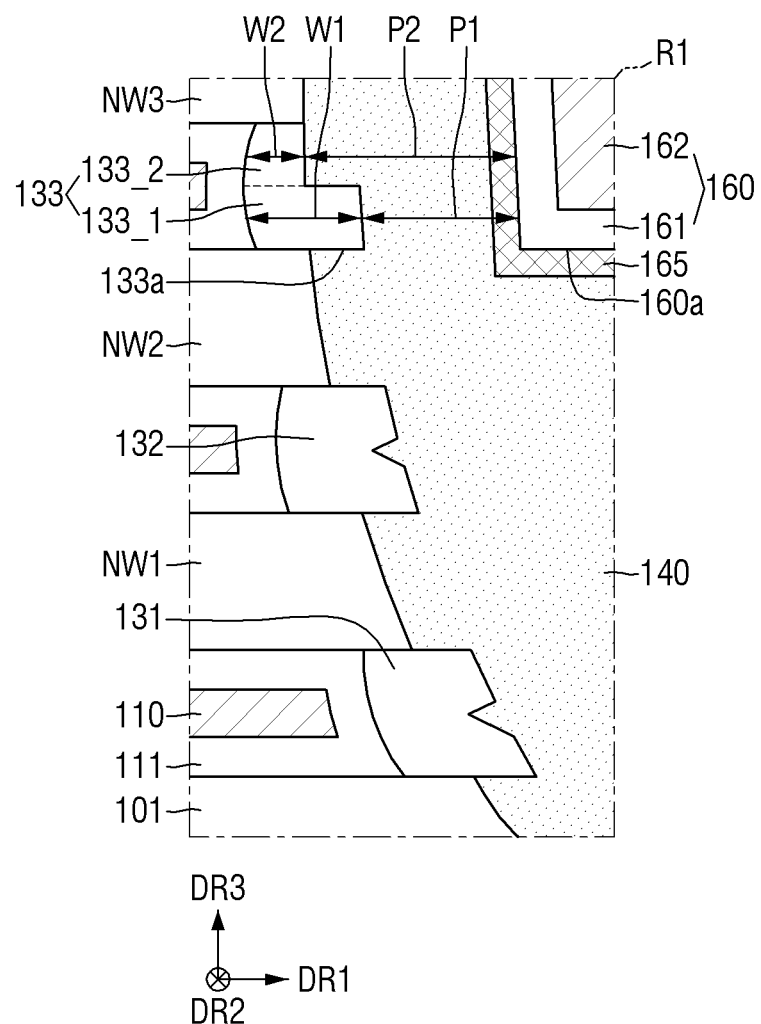
FIG. 3 is an enlarged view of region R1 of FIG. 2.

FIG. 1 is a layout diagram of a semiconductor device according to some embodiments of the present disclosure. FIG. 2 is a cross-sectional view taken along line A-A' of FIG. 1, FIG. 3 is an enlarged view of region R1 of FIG. 2, and FIG. 4 is a cross-sectional view taken along line B-B' of FIG. 1.

Referring to FIGS. 1 to 4, the semiconductor device according to some embodiments of the present disclosure may include a substrate 100, a first active pattern 101, a second active pattern 102, a field insulating film 105, first to sixth nanosheets NW1 to NW6, a first gate electrode 110, a gate insulating film 111, an outer spacer 112, a capping pattern 113, a second gate electrode 120, first to third inner spacers 131, 132, and 133, a source/drain region 140, an interlayer insulating film 150, a source/drain contact 160, and a silicide film 165.

For example, the substrate 100 may be a silicon substrate or a silicon-on-insulator (SOI). In another example, the substrate 100 may include silicon germanium, silicon germanium on insulator (SGOI), indium antimonide, lead tellurium compounds, indium arsenic, indium phosphide, gallium arsenide and/or gallium antimonide. An active region AR may protrude from the substrate 100 in a vertical direction DR3. As shown in FIG. 4, the active region AR may be defined by a deep trench DT.

Figure 4:
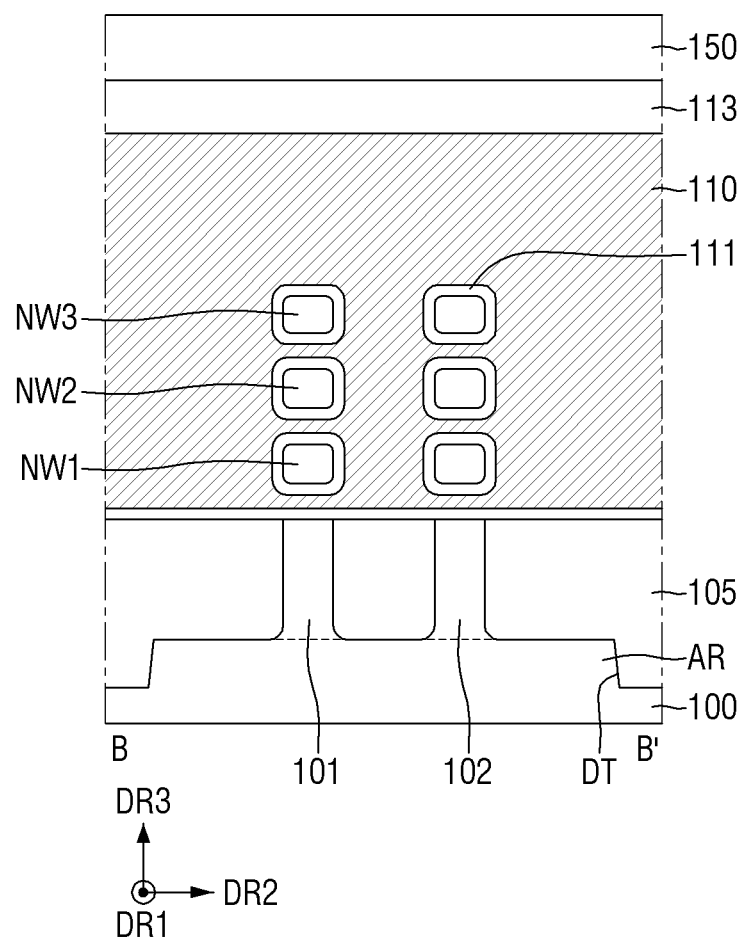
FIG. 4 is a cross-sectional view along line B-B' of FIG. 1.

Referring to FIGS. 1 and 4, the first active pattern 101 may extend in the first direction DR1 on the active region AR. The first active pattern 101 may protrude from the active region AR. The second active pattern 102 may extend in the first direction DR1 on the active region AR. The second active pattern 102 may be spaced apart from the first active pattern 101 in a second direction DR2 different from the first direction DR1. The second active pattern 102 may protrude from the active region AR.

In some embodiments, each of the first active pattern 101 and the second active pattern 102 may be, e.g., a fin-shaped pattern. Each of the first active pattern 101 and the second active pattern 102 may be used as a channel pattern of a transistor. Although FIG. 1 shows that two active patterns 101 and 102 are disposed in the active region AR, this is only for convenience of explanation, and the present disclosure is not limited thereto.

Each of the first active pattern 101 and the second active pattern 102 may be a part of the substrate 100, and may include an epitaxial layer that is grown from the substrate 100. Each of the first active pattern 101 and the second active pattern 102 may include, e.g., silicon or germanium, which is an elemental semiconductor material. Further, each of the first active pattern 101 and the second active pattern 102 may include a compound semiconductor, e.g., a group IV-IV compound semiconductor or a group III-V compound semiconductor.

The group IV-IV compound semiconductors may include, e.g., a binary compound or a ternary compound containing at least two or more of carbon (C), silicon (Si), germanium (Ge), and tin (Sn), or a compound obtained by doping these elements with a group IV element. The group III-V compound semiconductor may be, e.g., at least one of a binary compound, a ternary compound or a quaternary compound formed by combining at least one of aluminum (Al), gallium (Ga), and indium (In) as a group III element with one of phosphorus (P), arsenic (As), and antimony (Sb) as a group V element.

The field insulating film 105 may be formed on the substrate 100. The field insulating film 105 may fill the deep trench DT. Side walls of the active region AR may be surrounded by the field insulating film 105. The field insulating film 105 may be disposed on a part of the side wall of the first active pattern 101 and a part of the side wall of the second active pattern 102. The field insulating film 105 may include, e.g., an oxide film, a nitride film, an oxynitride film, or a combination film thereof.

The plurality of nanosheets may be disposed on each of the first active pattern 101 and the second active pattern 102. The plurality of nanosheets disposed on the first active pattern 101 may be spaced apart from the plurality of nanosheets disposed on the second active pattern 102 in the second direction DR2.

For example, first to third nanosheets NW1, NW2, and NW3 may be disposed on the first active pattern 101. The first to third nanosheets NW1, NW2, and NW3 may be stacked on the first active pattern 101 to be spaced apart from each other in the vertical direction DR3. Each of the first to third nanosheets NW1, NW2, and NW3 may extend in the first direction DR1.

Fourth to sixth nanosheets NW4, NW5, and NW6 may be disposed on the first active pattern 101. The fourth to sixth nanosheets NW4, NW5, and NW6 may be stacked on the first active pattern 101 to be spaced part from each other in the vertical direction DR3. Each of the fourth to sixth nanosheets NW4, NW5, and NW6 may extend in the first direction DR1. The fourth to sixth nanosheets NW4, NW5, and NW6 may be spaced apart from the first to third nanosheets NW1, NW2, and NW3 in the first direction DR1, as illustrated in FIG. 2. Although FIG. 2 shows that three nanosheets are stacked on the first active pattern 101, this is only for convenience of explanation, and the present disclosure is not limited thereto.

The first gate electrode 110 may extend in the second direction DR2 on the substrate 100. The first gate electrode 110 may intersect each of the first and second active patterns 101 and 102 on the first and second active patterns 101 and 102. The first gate electrode 110 may surround each of the first to third nanosheets NW1, NW2, and NW3.

The second gate electrode 120 may extend in the second direction DR2 on the substrate 100. The second gate electrode 120 may intersect each of the first and second active patterns 101 and 102 on the first and second active patterns 101 and 102. The second gate electrode 120 may be spaced apart from the first gate electrode 110 in the first direction DR1. The second gate electrode 120 may surround each of the fourth to sixth nanosheets NW4, NW5, and NW6.

Each of the first gate electrode 110 and the second gate electrode 120 may include, e.g., at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof. Each of the first gate electrode 110 and the second gate electrode 120 may include a conductive metal oxide, a conductive metal oxynitride, and the like, and may also include an oxidized form of the above-mentioned materials.

The gate insulating film 111 may be disposed between each of the first to third nanosheets NW1, NW2, and NW3 and the first gate electrode 110. The gate insulating film 111 may be disposed between each of the fourth to sixth nanosheets NW4, NW5, and NW6 and the first gate electrode 110.

Further, the gate insulating film 111 may be disposed between each of the first and second active patterns 101 and 102 and the first gate electrode 110. The gate insulating film 111 may be disposed between the field insulating film 105 and the first gate electrode 110. The gate insulating film 111 may be disposed between the outer spacer 112 and the first gate electrode 110.

The gate insulating film 111 may include, e.g., at least one of silicon oxide, silicon oxynitride, silicon nitride, or a high dielectric constant material having a higher dielectric constant than silicon oxide. The high dielectric constant material may include, e.g., one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some other embodiments may include a Negative Capacitance (NC) FET using a negative capacitor. For example, the gate insulating film 111 may include a ferroelectric material film having ferroelectric properties, and a paraelectric material film having the paraelectric properties.

The ferroelectric material film may have a negative capacitance, and the paraelectric material film may have a positive capacitance. For example, when two or more capacitors are connected in series, and the capacitance of each capacitor has a positive value, the entire capacitance decreases from the capacitance of each individual capacitor. On the other hand, when at least one of the capacitances of two or more capacitors connected in series has a negative value, the entire capacitance has a positive value and may be greater than an absolute value of each individual capacitance.

When the ferroelectric material film having the negative capacitance and the paraelectric material film having the positive capacitance are connected in series, the entire capacitance values of the ferroelectric material film and the paraelectric material film connected in series may increase. Taking advantage of the increased overall capacitance value, a transistor including the ferroelectric material film may have a subthreshold swing (SS) of less than 60 mV/decade at room temperature.

The ferroelectric material film may have ferroelectric properties. The ferroelectric material film may include, e.g., at least one of hafnium oxide, hafnium zirconium oxide, barium strontium titanium oxide, barium titanium oxide, and lead zirconium titanium oxide. For example, the hafnium zirconium oxide may be a material obtained by doping hafnium oxide with zirconium (Zr). In another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, e.g., at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include at least one of, e.g., a silicon oxide and a metal oxide having a high dielectric constant. The metal oxide included in the paraelectric material film may include, e.g., at least one of hafnium oxide, zirconium oxide, and aluminum oxide.

The ferroelectric material film and the paraelectric material film may include the same material. The ferroelectric material film has ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a sufficient thickness to impart ferroelectric properties. A thickness of the ferroelectric material film may be, e.g., about 0.5 nm to about 10 nm. Since a critical thickness that exhibits the ferroelectric properties may vary for each ferroelectric material, the thickness of the ferroelectric material film may vary depending on the ferroelectric material.

For example, the gate insulating film 111 may include one ferroelectric material film. In another example, the gate insulating film 111 may include a plurality of ferroelectric material films spaced apart from each other. The gate insulating film 111 may have a stacked film structure in which the plurality of ferroelectric material films and the plurality of paraelectric material films are alternately stacked.

For example, the outer spacer 112 may be disposed on the side walls of the first gate electrode 110 on the third nanosheet NW3. The outer spacer 112 may be disposed on the side walls of the first gate electrode 110 on each of the first active pattern 101, the second active pattern 102, and the field insulating film 105. Further, the outer spacer 112 may be disposed on the side walls of the second gate electrode 120 on the sixth nanosheet NW6. The outer spacer 112 may be disposed on the side walls of the second gate electrode 120 on each of the first active pattern 101, the second active pattern 102, and the field insulating film 105. The outer spacer 112 may include, e.g., at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof.

The capping pattern 113 may be disposed on each of the first gate electrode 110 and the second gate electrode 120. Although FIG. 2 shows that the capping pattern 113 is disposed on the upper surface of the gate insulating film 111 between the inner side walls of the outer spacer 112, the present disclosure is not limited thereto. In some other embodiments, the capping pattern 113 may be disposed on the upper surface of the outer spacer 112, the upper surface of the gate insulating film 111, the upper surface of the first gate electrode 110, and the upper surface of the second gate electrode 120.

The capping pattern 113 may include, e.g., a material having an etching selectivity with respect to the interlayer insulating film 150. The capping pattern 113 may include, e.g., at least one of silicon nitride (SiN), silicon oxynitride (SiON), silicon oxide ($SiO_2$), silicon carbonitride (SiCN), silicon oxycarbonitride (SiOCN), and combinations thereof.

The source/drain region 140 may be disposed on at least one side of the first gate electrode 110 on the active region AR. Also, the source/drain region 140 may be disposed on at least one side of the second gate electrode 120 on the active region AR. The source/drain region 140 may be in contact each of the first to sixth nanosheets NW1 to NW6. Although FIG. 2 shows that the upper surface of the source/drain region 140 is formed to be higher than each of the upper surface of the sixth nanosheet NW6 and the upper surface of the third nanosheet NW3, the present disclosure is not limited thereto.

A plurality of inner spacers, i.e., the first through third inner spacers 131 through 133, may be disposed between the first gate electrode 110 and the source/drain region 140, and between the second gate electrode 120 and the source/drain region 140.

For example, referring to FIG. 2, the first inner spacer 131 may be disposed between the first active pattern 101 and the first nanosheet NW1. Further, the first inner spacer 131 may be disposed between the first active pattern 101 and the fourth nanosheet NW4. The first inner spacer 131 may be disposed between the gate insulating film 111 and the source/drain region 140.

As illustrated in FIG. 3, at least a part of the first inner spacer 131 may extend into the source/drain region 140. That is, at least a part of the first inner spacer 131 may protrude toward the source/drain region 140.

A second inner spacer 132 may be disposed between the first nanosheet NW1 and the second nanosheet NW2. Further, the second inner spacer 132 may be disposed between the fourth nanosheet NW4 and the fifth nanosheet NW5. The second inner spacer 132 may be disposed between the gate insulating film 111 and the source/drain region 140.

At least a part of the second inner spacer 132 may extend into the source/drain region 140. That is, at least a part of the second inner spacer 132 may protrude toward the source/drain region 140.

A third inner spacer 133 may be disposed at the uppermost part of the plurality of inner spacers surrounded by the first gate electrode 110. Also, the third inner spacer 133 may be disposed at the uppermost part of the plurality of inner spacers surrounded by the second gate electrode 120. That is, the third inner spacer 133 may be referred to as an uppermost inner spacer.

The third inner spacer 133 may be disposed between the second nanosheet NW2 and the third nanosheet NW3. Further, the third inner spacer 133 may be disposed between the fifth nanosheet NW5 and the sixth nanosheet NW6. The third inner spacer 133 may be disposed between the gate insulating film 111 and the source/drain region 140.

At least a part of the third inner spacer 133 may extend into the source/drain region 140. That is, at least a part of the third inner spacer 133 may protrude toward the source/drain region 140.

The third inner spacer 133 may include a first portion 133_1, and a second portion 133_2 disposed on the upper surface of the first portion 133_1. The first portion 133_1 of the third inner spacer 133 may be disposed adjacent to, e.g., directly on, the second nanosheet NW2, and the second portion 133_2 of the third inner spacer 133 may be disposed adjacent to the third nanosheet NW3, e.g., the second portion 133_2 of the third inner spacer 133 may be directly between the upper surface of the first portion 133_1 of the third inner spacer 133 and the lower surface of the third nanosheet NW3.

The third inner spacer 133 may have an L-shape. In detail, the first portion 133_1 of the third inner spacer 133 may further protrude toward the source/drain region 140 beyond the second portion 133_2 of the third inner spacer 133 to define the L-shape. The second portion 133_2 of the third inner spacer 133 may be disposed between the second nanosheet NW2 and the third nanosheet NW3. At least a part of the first portion 133_1 of the third inner spacer 133 may extend into the source/drain region 140, e.g., in the first direction DR1 beyond the second portion 133_2 to have at least three different surfaces directly contact the source/drain region 140.

At least a part of the first portion 133_1 of the third inner spacer 133 extending into the source/drain region 140 does not overlap the second portion 133_2 of the third inner spacer 133 in the vertical direction DR3. The side wall of the second portion 133_2 of the third inner spacer 133 may have a continuous slope profile with the side wall of the third nanosheet NW3. This is because a part of the third inner spacer 133 protruding laterally from the third nanosheet NW3 is etched in the process of forming the third inner spacer 133. A width W1 of the first portion 133_1 of the third inner spacer 133 in the first direction DR1 may be greater than a width W2 of the second portion 133_2 of the third inner spacer 133 in the first direction DR1.

Each of the first to third inner spacers 131, 132, and 133 may include, e.g., at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof. However, the present disclosure is not limited thereto.

The interlayer insulating film 150 may be disposed to cover the outer spacer 112, the capping pattern 113, the field insulating film 105, and the source/drain region 140. The interlayer insulating film 150 may include, e.g., at least one of silicon oxide, silicon nitride, silicon oxynitride, and a low dielectric constant material. The low dielectric constant material may include, e.g., Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethylCycloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), Tonen SilaZen (TOSZ), Fluoride Silicate Glass (FSG), polyimide nanofoams such as polypropylene oxide, Carbon Doped silicon Oxide (CDO), Organo Silicate Glass (OSG), SiLK, Amorphous Fluorinated Carbon, silica aerogels, silica xerogels, mesoporous silica or combinations thereof.

The source/drain contact 160 may be disposed on the source/drain region 140.

The source/drain contact 160 may penetrate the interlayer insulating film 150 in the vertical direction DR3 and extend into the source/drain region 140. For example, the source/drain contact 160 may extend to the depth at which the third inner spacer 133 is disposed. That is, the source/drain contact 160 may overlap the third inner spacer 133 in the first direction DR1. For example, a lower surface 160a of the source/drain contact 160 may be formed on the same plane as a lower surface 133a of the third inner spacer 133, e.g., the lower surface 160a of the source/drain contact 160 may be coplanar (e.g., level) with the lower surface 133a of the third inner spacer 133.

A first pitch P1 in the first direction DR1 between the first portion 133_1 of the third inner spacer 133 and the source/drain contact 160 may be smaller than a second pitch P2 in the first direction DR1 between the second portion 133_2 of the third inner spacer 133 and the source/drain contact 160. That is, the first portion 133_1 of the third inner spacer 133 may be disposed to be closer to the source/drain contact 160 than the second portion 133_2 of the third inner spacer 133.

The source/drain contact 160 may include a source/drain contact barrier film 161 and a source/drain contact filling film 162. The source/drain contact barrier film 161 may form side walls and a bottom surface of the source/drain contact 160. The source/drain contact barrier film 161 may include, e.g., at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and rhodium (Rh).

The source/drain contact filling film 162 may be disposed on the source/drain contact barrier film 161. The source/drain contact filling film 162 may include, e.g., at least one of aluminum (Al), copper (Cu), tungsten (W), cobalt (Co), ruthenium (Ru), and molybdenum (Mo).

The silicide film 165 may be disposed between the source/drain region 140 and the source/drain contact 160. The silicide film 165 may be disposed along a profile of an interface between the source/drain region 140 and the source/drain contact 160. The silicide film 165 may include, e.g., a metal silicide material.

In the semiconductor device according to some embodiments of the present disclosure, by forming a lower width W1 of the inner spacer 133 disposed adjacent to the source/drain contact 160 to be larger than an upper width W2, the pitch between the inner spacer 133 and the source/drain contact 160 may be increased, and the reliability of the semiconductor device may be improved. Further, the semiconductor device according to some embodiments of the present disclosure may prevent an occurrence of deterioration between the gate electrode 110 and the source/drain region 140, by reducing only the upper width W2 in the state of maintaining the lower width W1 of the inner spacer 133 disposed adjacent to the source/drain contact 160.

Hereinafter, a method for fabricating a semiconductor device according to some embodiments of the present disclosure will be described referring to FIGS. 2 and 5 to 13. FIGS. 5 to 13 are cross-sectional views of stages in a method for fabricating a semiconductor device according to some embodiments of the present disclosure. FIGS. 5 to 13 correspond to the view of FIG. 2.

Figure 5:
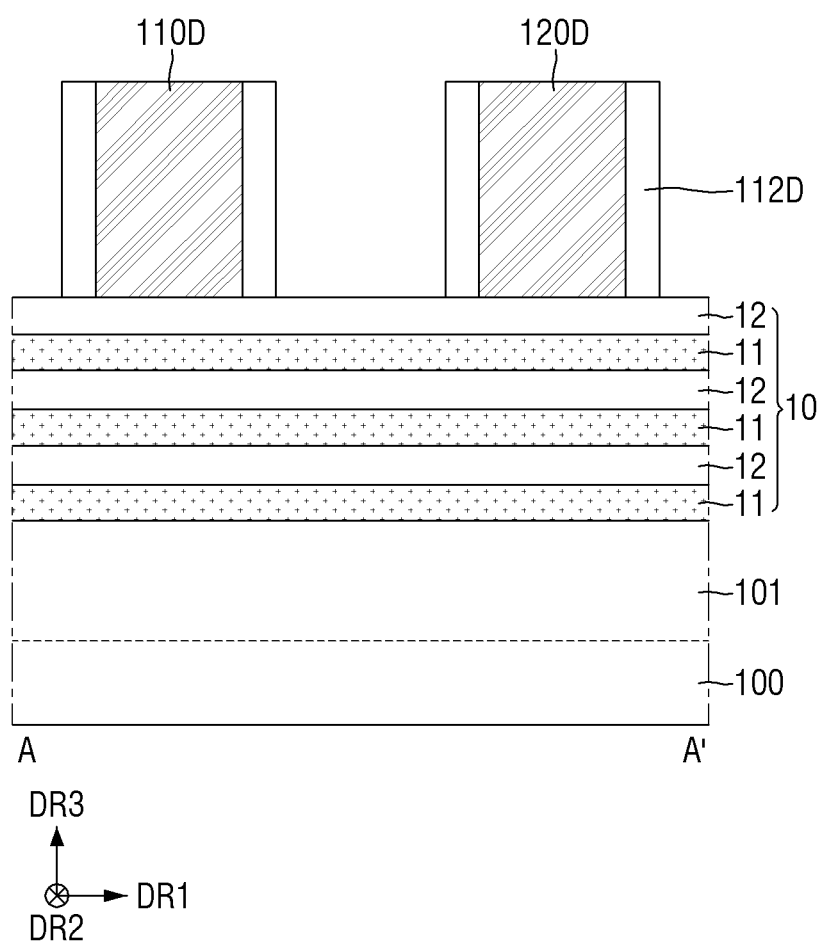
FIGS. 5 to 13 are intermediate stage diagrams in a method for fabricating a semiconductor device according to some embodiments.

Referring to FIG. 5, a stacked structure 10, in which the first semiconductor layer 11 and the second semiconductor layer 12 are alternately stacked, may be formed on the substrate 100. For example, the first semiconductor layer 11 may be formed at the lowermost part of the stacked structure 10, and the second semiconductor layer 12 may be formed at the uppermost part of the stacked structure 10. The first semiconductor layer 11 may include, e.g., silicon (Si). The second semiconductor layer 12 may include, e.g., silicon germanium (SiGe).

Subsequently, a deep trench (DT of FIG. 4) may be formed on the substrate 100 to define an active region (AR of FIG. 4). Subsequently, a first active pattern 101 and a second active pattern 102 may be formed on the active region AR in FIG. 4, respectively.

Subsequently, a first dummy gate 110D and a second dummy gate 120D may be formed on the stacked structure 10. Each of the first dummy gate 110D and the second dummy gate 120D may extend in the second direction DR2. The second dummy gate 120D may be spaced apart from the first dummy gate 110D in the first direction DR1.

Subsequently, a dummy gate spacer 112D may be formed along both side walls of each of the first dummy gate 110D and the second dummy gate 120D. The dummy gate spacer 112D may extend in the second direction DR2.

Figure 6:
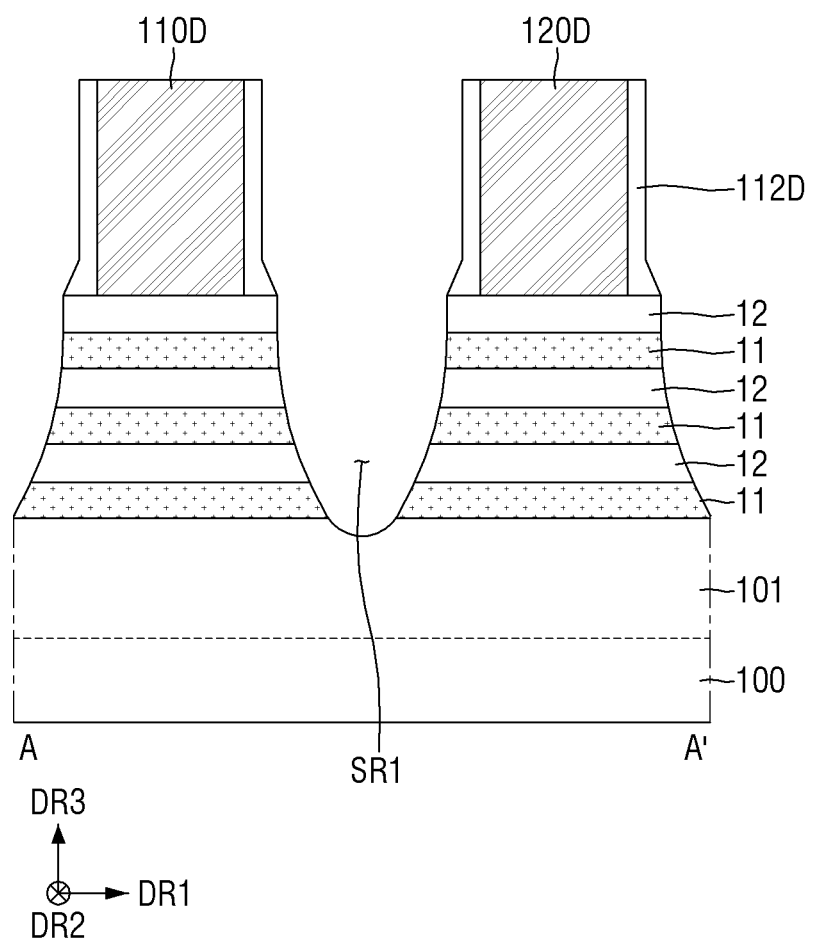

Referring to FIG. 6, a first recess SR1 may be formed, by etching the stacked structure 10 using the first dummy gate 110D, the second dummy gate 120D, and the dummy gate spacer 112D as masks. For example, as illustrated in FIG. 6, the first recess SR1 may be formed in a region of the stacked structure 10 between the first and second dummy gates 110D and 120D, e.g., so parts of side walls of the first and second semiconductor layers 11 and 12 may be exposed through the first recess SR1.

For example, a part of the side walls of the dummy gate spacer 112D may be etched, while the first recess SR1 is being formed. As a result, the width of the lower part of the dummy gate spacer 112D in the first direction DR1 may be formed to be greater than the width of the upper part of the dummy gate spacer 112D in the first direction DR1. For example, a part of the first active pattern 101 may also be etched, while the first recess SR1 is being formed.

Figure 7:
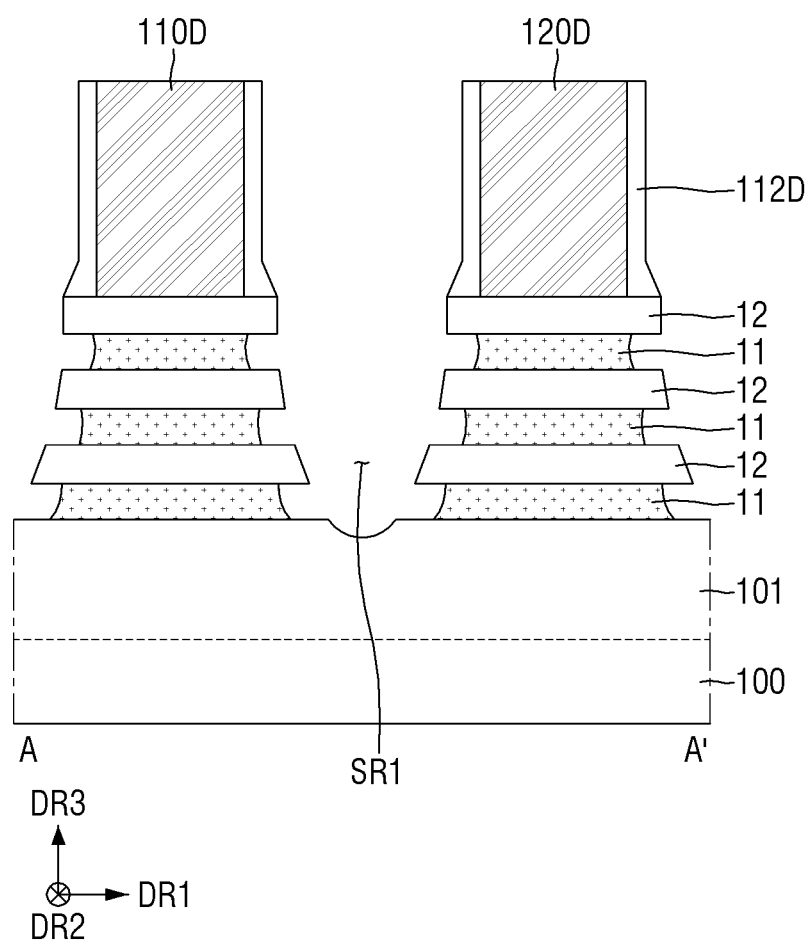

Referring to FIG. 7, a part of the side walls of the first semiconductor layer 11 exposed through the first recess SR1 may be etched. As a result, the side walls of the first semiconductor layer 11 may be formed to be retracted further than the side walls of the second semiconductor layer 12. For example, as illustrated in FIG. 7, the second semiconductor layer 12 may extend beyond the first semiconductor layer 11 in the first direction DR1.

Figure 8:
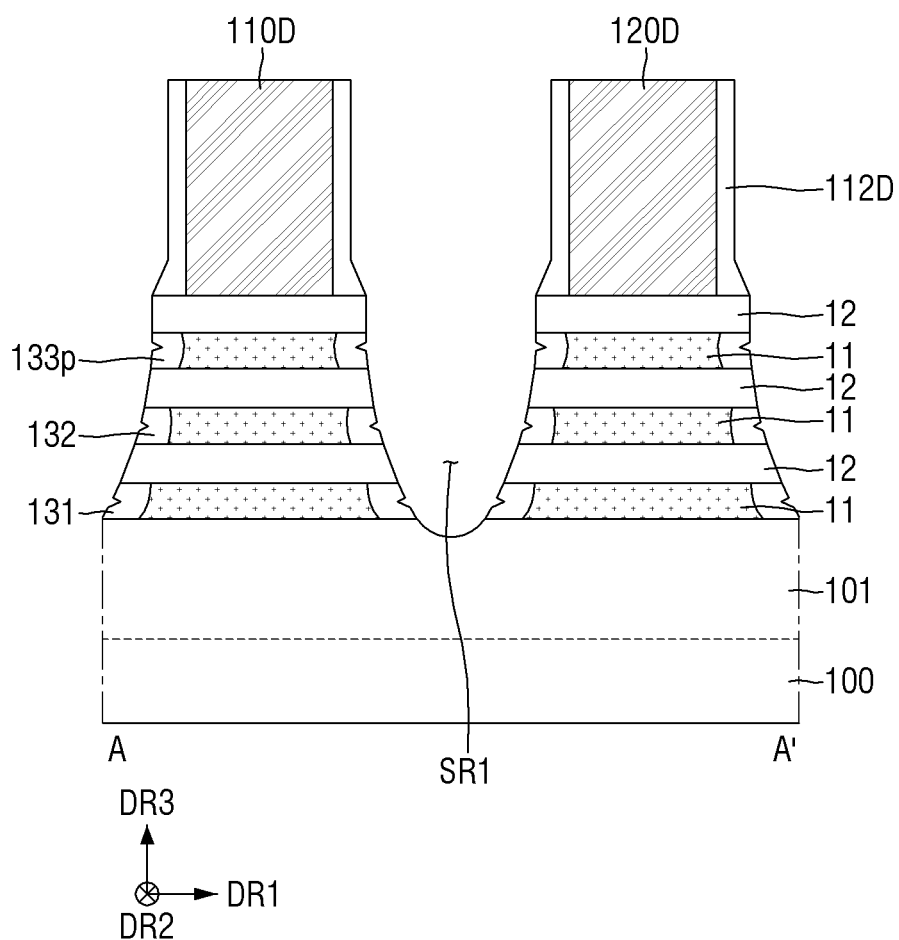

Referring to FIG. 8, an inner spacer may be formed in a portion in which a part of the side wall of the first semiconductor layer 11 is etched. For example, the first inner spacer 131, the second inner spacer 132, and a pre third inner spacer 133p may be formed in a portion in which a part of the side walls of the first semiconductor layer 11 is etched so that they are sequentially spaced apart from each other in the vertical direction DR3. For example, as illustrated in FIG. 8, the first inner spacer 131, the second inner spacer 132, and a pre third inner spacer 133p may be formed between respective second semiconductor layer 12, e.g., to fill in respective regions of the retracted semiconductor layers 11 in the first direction DR1.

Figure 9:
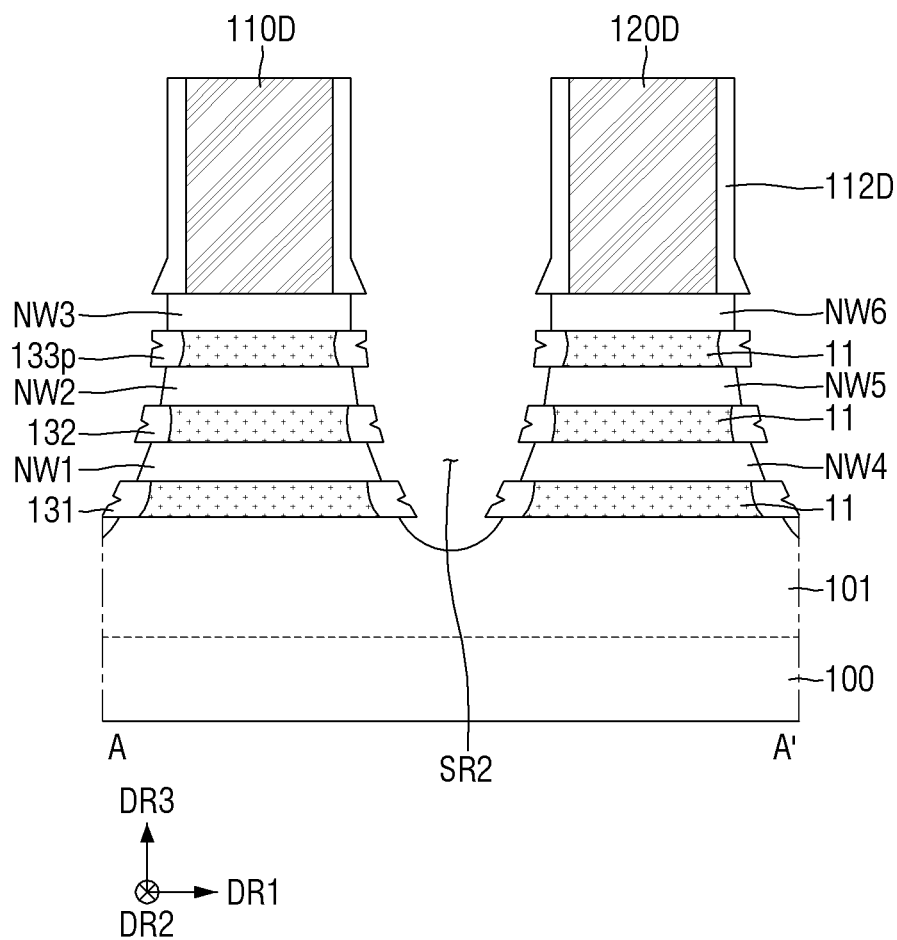

Referring to FIG. 9, a part of the side walls of the second semiconductor layer 12 exposed through the first recess SR1 may be etched to form a second recess SR2, e.g., the second recess SR2 may be formed by widening the first recess SR1. In addition, a part of the side walls of the second semiconductor layer 12 exposed through the first recess SR1 may be etched to form first to sixth nanosheets NW1 to NW6.

The side walls of each of the first to sixth nanosheets NW1 to NW6 may be formed to be retracted further than the side walls of the first inner spacer 131, the second inner spacer 132, and the pre third inner spacer 133p. That is, each of the first inner spacer 131, the second inner spacer 132, and the pre third inner spacer 133p may protrude from, e.g., beyond, the side walls of each of the first to sixth nanosheets NW1 to NW6, e.g., in the first direction DR1. While a part of the side walls of the second semiconductor layer 12 is being etched, a part of the first active pattern 101 may also be etched.

Figure 10:
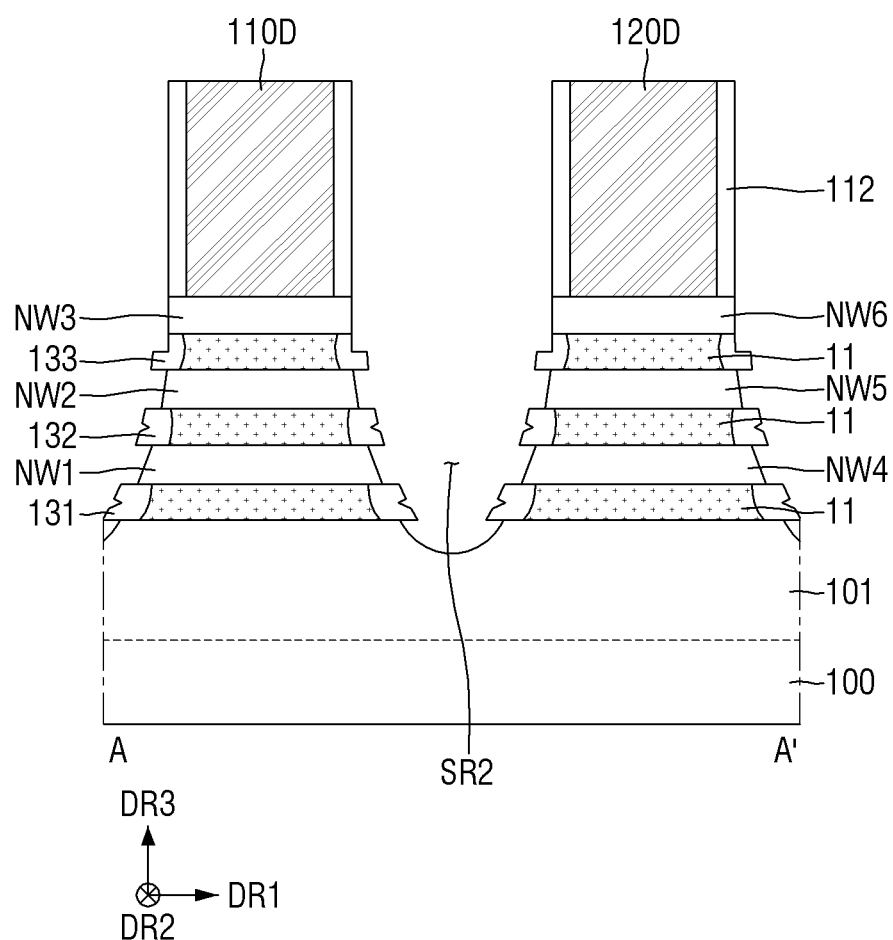

Referring to FIG. 10, a part of the upper part of the pre third inner spacer 133p exposed to the second recess SR2 may be etched to form the third inner spacer 133. For example, a part of the upper part of the pre third inner spacer 133p may be etched through a linear etching process. For example, as illustrated in FIG. 10, the upper part of the pre third inner spacer 133p may be etched, such that a lateral surface of the upper part of the resultant third inner spacer 133 may be level with a lateral surface of the third nanosheets NW3. The resultant third inner spacer 133 may have an L shape in which the width W1 of the lower first portion (133_1 of FIG. 3) in the first direction DRI is formed to be greater than the width W2 of the upper second portion (133_2 of FIG. 3) in the direction DR1.

Through the linear etching process, a part of the lower part of the dummy gate spacer 112D protruding in the lateral direction may be etched to form the outer spacer 112. The side walls of the outer spacer 112, the side walls of the third nanosheet NW3, and the side walls of the second portion (133_2 of FIG. 3) of the third inner spacer 133 may have a continuous slope profile. For example, as illustrated in FIG. 10, outer surfaces, i.e., surfaces facing away from the first dummy gate 110D, of the side walls of the outer spacer 112, of the side walls of the third nanosheet NW3, and of the side walls of the second portion (133_2 of FIG. 3) of the third inner spacer 133 may have a continuous slope profile.

Figure 11:
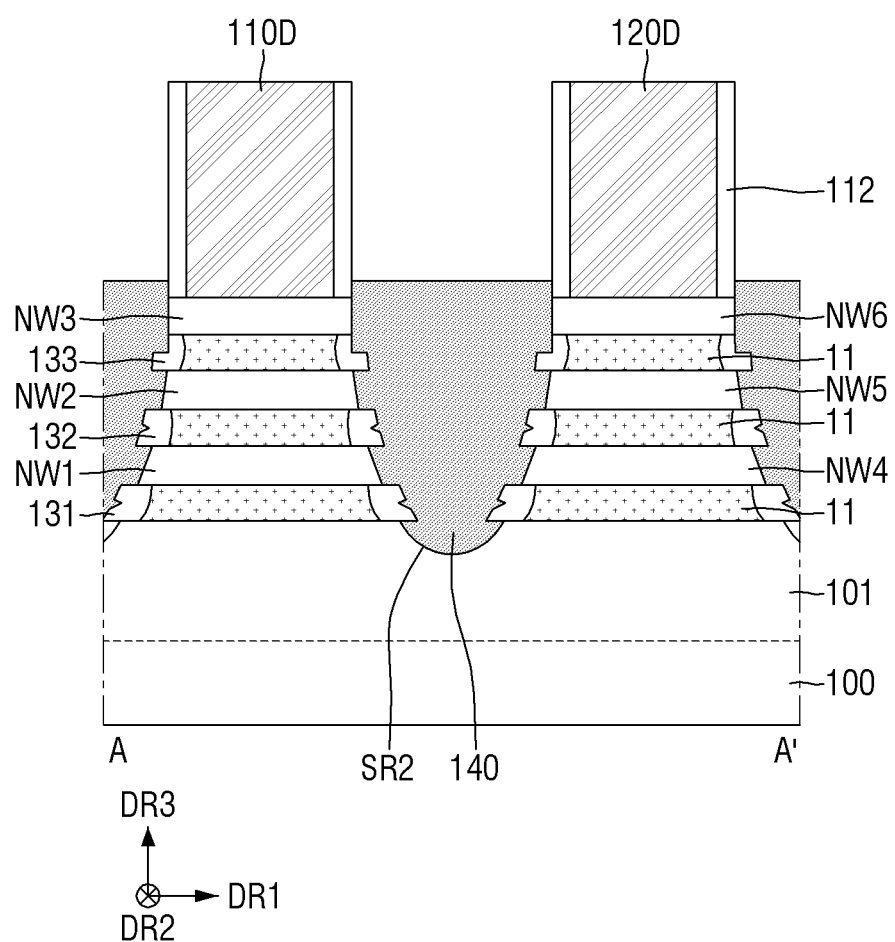

Referring to FIG. 11, the source/drain region 140 may be formed inside the second recess SR2. For example, an upper surface of the source/drain region 140 may be formed to be higher than each of the upper surface of the third nanosheet NW3 and the upper surface of the sixth nanosheet NW6.

Figure 12:
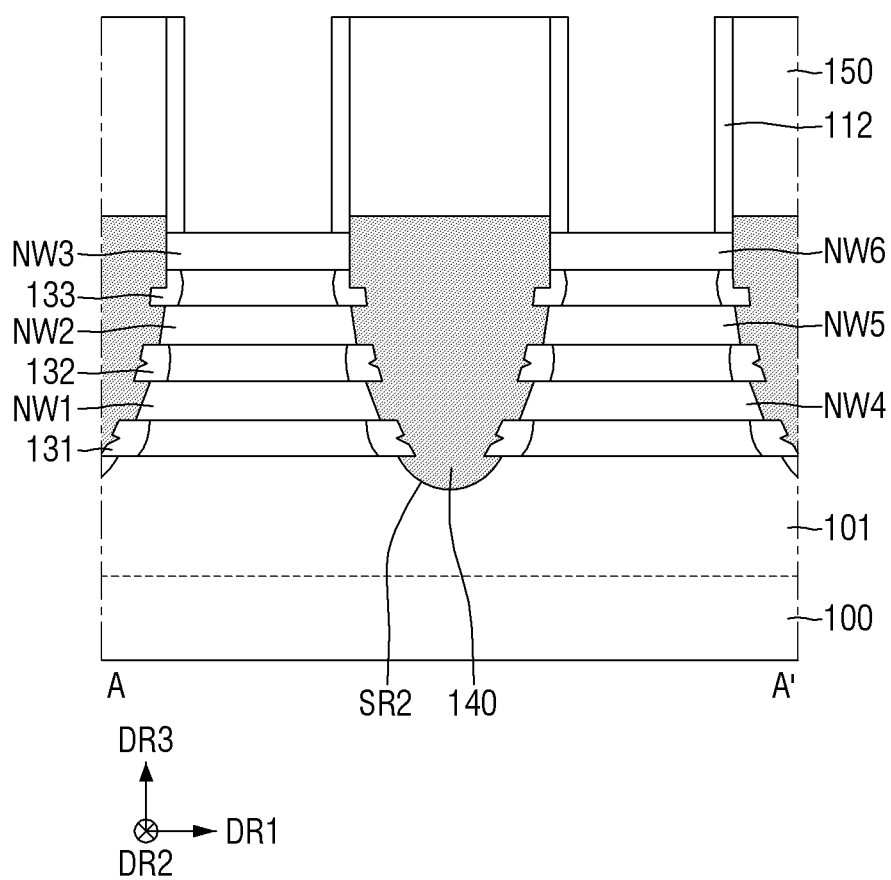

Referring to FIG. 12, the interlayer insulating film 150 may be formed to cover the source/drain region 140, the outer spacer 112, the first dummy gate 110D, and the second dummy gate 120D. Subsequently, a flattening process may be performed to expose each of the first dummy gate 110D and the second dummy gate 120D. Subsequently, each of the first dummy gate 110D and the second dummy gate 120D may be removed.

Figure 13:
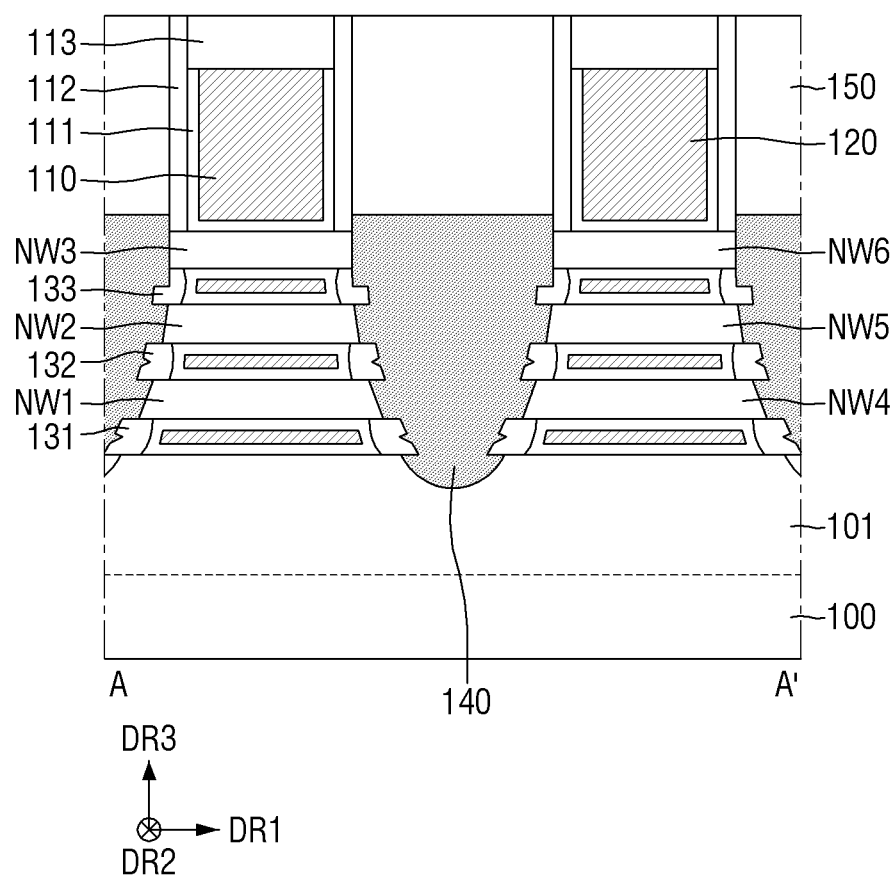

Referring to FIG. 13, the gate insulating film 111, the first gate electrode 110, and the capping pattern 113 may be formed in a portion from which the first dummy gate 110D is removed. Further, the gate insulating film 111, the second gate electrode 120, and the capping pattern 113 may be formed in a portion from which the second dummy gate 120D is removed.

Referring to FIG. 2, after the interlayer insulating film 150 is further formed to cover the capping pattern 113, the silicide film 165 and the source/drain contact 160 may be formed. The source/drain contact 160 may penetrate the interlayer insulating film 150 in the vertical direction DR3 and extend to the source/drain region 140. For example, the source/drain contact 160 may extend to a same depth as the third nanosheet NW3 and the sixth nanosheet NW6, e.g., the source/drain contact 160 may extend to have its bottom coplanar with bottoms of the third nanosheet NW3 and the sixth nanosheet NW6 .

The silicide film 165 may be formed between the source/drain region 140 and the source/drain contact 160. Through such a fabricating method, the semiconductor device shown in FIG. 2 may be fabricated.

Hereinafter, a semiconductor device according to some other embodiments of the present disclosure will be described referring to FIG. 14. Differences relative to the semiconductor device shown in FIGS. 1 to 4 will be mainly described.

Figure 14:
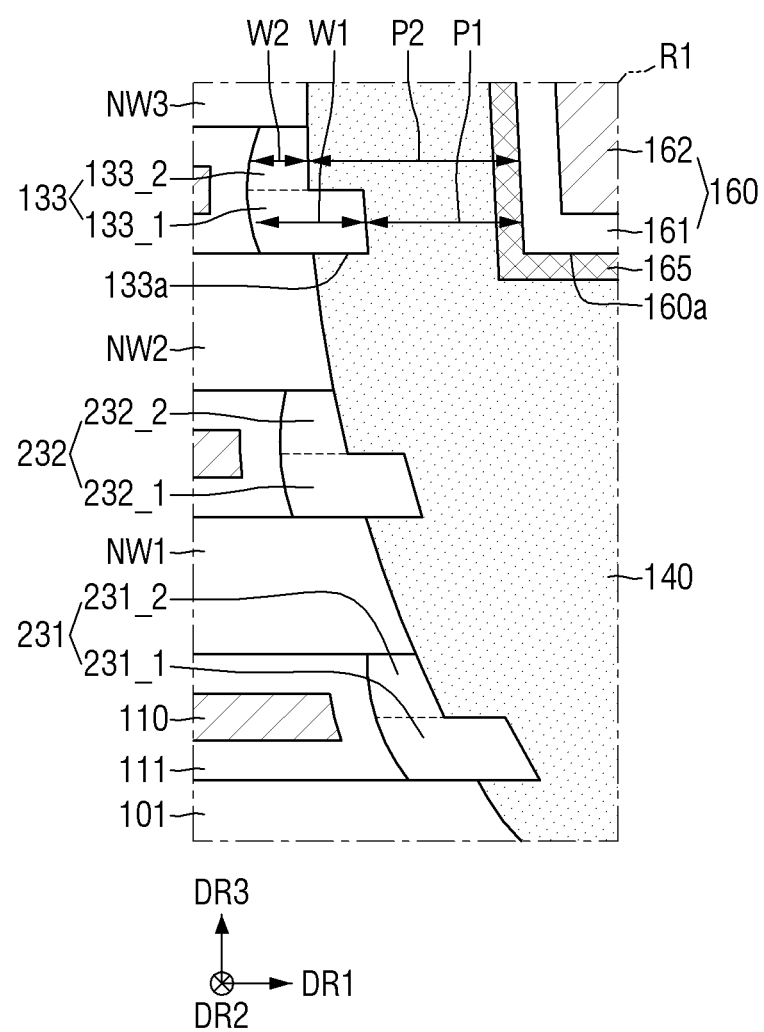
FIG. 14 is an enlarged view of a semiconductor device according to some other embodiments.

FIG. 14 is an enlarged view of a semiconductor device according to some other embodiments of the present disclosure. FIG. 14 corresponds to the view of FIG. 3.

Referring to FIG. 14, in the semiconductor device according to some other embodiments of the present disclosure, each of a first inner spacer 231, a second inner spacer 232, and the third inner spacer 133 may have an L-shape. The first inner spacer 231 and the second inner spacer 232 may have a shape similar to that of the third inner spacer 133.

For example, the first inner spacer 231 may include a first portion 231_1, and a second portion 231_2 disposed on an upper surface of the first portion 231_1. The first portion 231_1 of the first inner spacer 231 may be disposed adjacent to the first active pattern 101, and the second portion 231_2 of the first inner spacer 231 may be disposed adjacent to the first nanosheet NW12.

The first portion 231_1 of the first inner spacer 231 may further protrude toward the source/drain region 140 beyond the second portion 231_2 of the first inner spacer 231. The second portion 231_2 of the first inner spacer 231 may be disposed between the first nanosheet NW1 and the first portion 231_1 of the first inner spacer 231. At least a part of the first portion 231_1 of the first inner spacer 231 may extend into the source/drain region 140, e.g., at least three different surfaces of the first portion 231_1 may be in direct contact with the source/drain region 140.

At least a part of the first portion 231_1 of the first inner spacer 231 extending into the source/drain region 140 does not overlap the second portion 231_2 of the first inner spacer 231 in the vertical direction DR3. The side walls of the second portion 231_2 of the first inner spacer 231 may have a continuous slope profile with the side walls of the first nanosheet NW1. The width of the first portion 231_1 of the first inner spacer 231 in the first direction DR1 may be greater than the width of the second portion 231_2 of the first inner spacer 231 in the first direction DR1.

The second inner spacer 232 may include a first portion 232_1, and a second portion 232_2 disposed on the upper surface of the first portion 232_1. The first portion 232_1 of the second inner spacer 232 may be disposed adjacent to the first nanosheet NW1, and the second portion 232_2 of the second inner spacer 232 may be disposed adjacent to the second nanosheet NW2.

The first portion 232_1 of the second inner spacer 232 may further protrude toward the source/drain region 140 beyond the second portion 232_2 of the second inner spacer 232. The second portion 232_2 of the second inner spacer 232 may be disposed between the second nanosheet NW2 and the first nanosheet NW1. At least a part of the first portion 232_1 of the second inner spacer 232 may extend into the source/drain region 140.

At least a part of the first portion 232_1 of the second inner spacer 232 extending into the source/drain region 140 does not overlap the second portion 232_2 of the second inner spacer 232 in the vertical direction DR3. The side walls of the second portion 232_2 of the second inner spacer 232 may have a continuous slope profile with the side walls of the second nanosheet NW2. The width of the first portion 232_1 of the second inner spacer 232 in the first direction DR1 may be greater than the width of the second portion 232_2 of the second inner spacer 232 in the first direction DR1.

Although FIG. 14 shows that all the inner spacers have an L-shape, the present disclosure is not limited thereto. In some other embodiments, only the second inner spacer 232 and/or the third inner spacer 133 may have an L-shape.

Hereinafter, a semiconductor device according to some other embodiments of the present disclosure will be described referring to FIG. 15. Differences relative to the semiconductor devices shown in FIGS. 1 to 4 will be mainly described.

Figure 15:
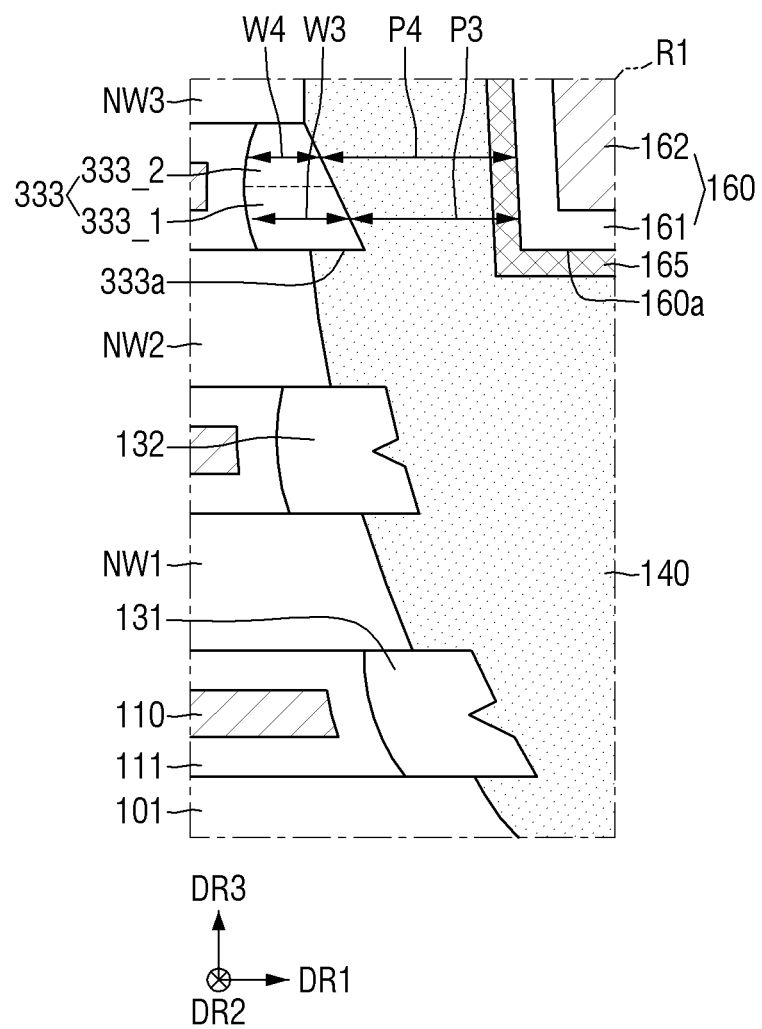
FIG. 15 is an enlarged view of a semiconductor device according to some other embodiments.

FIG. 15 is an enlarged view of a semiconductor device according to some other embodiments of the present disclosure. FIG. 15 corresponds to the view of FIG. 3.

Referring to FIG. 15, in the semiconductor device according to some other embodiment of the present disclosure, a side wall of a first portion 333_1 of a third inner spacer 333 and a side wall of a second portion 333_2 of the third inner spacer 333 may have a continuous slope profile. For example, as illustrated in FIG. 15, the side walls of the first portion 333_1 and the second portion 333_2 of the third inner spacer 333 that face, e.g., and contact, the source/drain region 140 may be level with each other to define a single plane.

A part of a lower surface 333a of the first portion 333_1 of the third inner spacer 333 may be in contact with the second nanosheet NW2. An upper surface of the second portion 333_2 of the third inner spacer 333 may be in contact with the third nanosheet NW3.

A width W3 of the first portion 333_1 of the third inner spacer 333 in the first direction DR1 may be greater than a width W4 of the second portion 333_2 of the third inner spacer 333 in the first direction DR1. A third pitch P3 in the first direction DR1 between the first portion 333_1 of the third inner spacer 333 and the source/drain contact 160 may be smaller than a fourth pitch P4 in the first direction DR1 between the second portion 333_2 of the third inner spacer 333 and the source/drain contact 160.

Hereinafter, a semiconductor device according to some other embodiments of the present disclosure will be described referring to FIG. 16. Differences relative to the semiconductor device shown in FIG. 15 will be mainly described.

Figure 16:
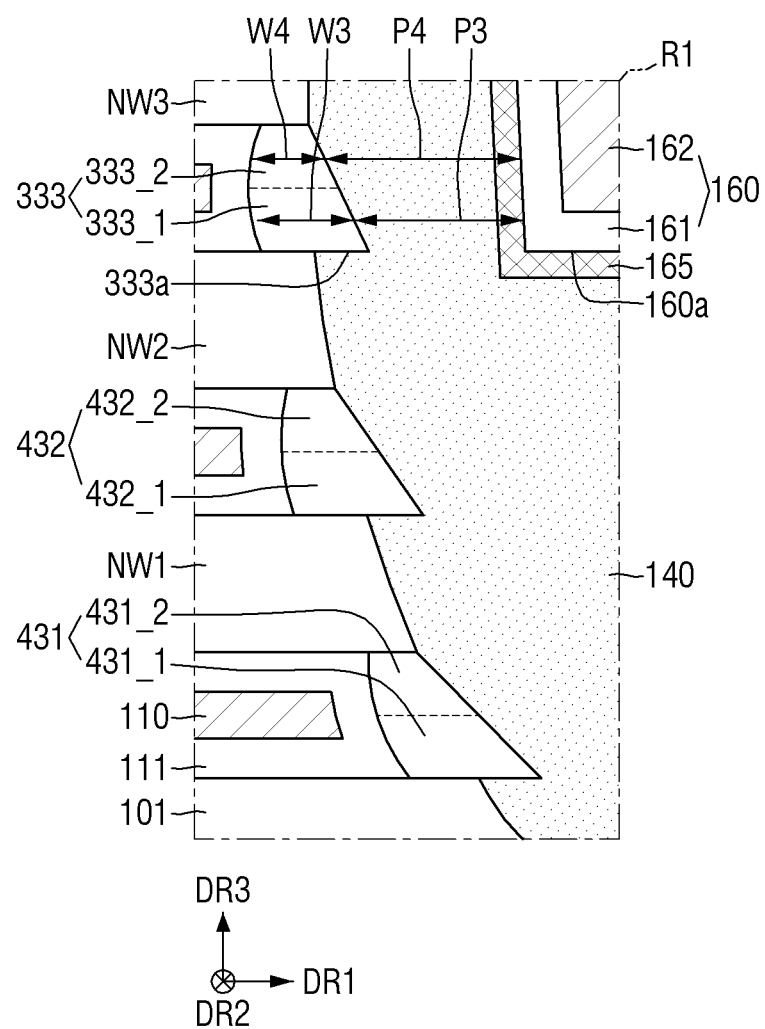
FIG. 16 is an enlarged view of a semiconductor device according to some other embodiments.

FIG. 16 is an enlarged view of a semiconductor device according to some other embodiments of the present disclosure. FIG. 16 corresponds to the view of FIG. 3.

Referring to FIG. 16, in the semiconductor device according to some other embodiment of the present disclosure, each of a first inner spacer 431 and a second inner spacer 432 may have a shape similar to that of the third inner spacer 333.

The first inner spacer 431 may include a first portion 431_1, and a second portion 431_2 disposed on an upper surface of the first portion 431_1. Side walls of the first portion 431_1 of the first inner spacer 431 and side walls of the second portion 431_2 of the first inner spacer 431 may have a continuous slope profile.

A part of the lower surface of the first portion 431_1 of the first inner spacer 431 may be in contact with the first active pattern 101. The upper surface of the second portion 431_2 of the first inner spacer 431 may be in contact with the first nanosheet NW1.

A width of the first portion 431_1 of the first inner spacer 431 in the first direction DR1 may be greater than a width of the second portion 431_2 of the first inner spacer 431 in the first direction DR1.

The second inner spacer 432 may include a first portion 432_1, and a second portion 432_2 disposed on an upper surface of the first portion 432_1. The side walls of the first portion 432_1 of the second inner spacer 432 and the side walls of the second portion 432_2 of the second inner spacer 432 may have a continuous slope profile, e.g., the side walls of the first portion 432_1 and the second portion 432_2 of the second inner spacer 432 that face, e.g., and contact, the source/drain region 140 may be level with each other to define a single plane.

A part of the lower surface of the first portion 432_1 of the second inner spacer 432 may be in contact with the first nanosheet NW1. The upper surface of the second portion 432_2 of the second inner spacer 432 may be in contact with the second nanosheet NW2. A width of the first portion 432_1 of the second inner spacer 432 in the first direction DR1 may be greater than a width of the second portion 432_2 of the second inner spacer 432 in the first direction DR1.

Hereinafter, a semiconductor device according to some other embodiments of the present disclosure will be described referring to FIGS. 17 and 18. Differences relative to the semiconductor device shown in FIGS. 1 to 4 will be mainly described.

Figure 17:
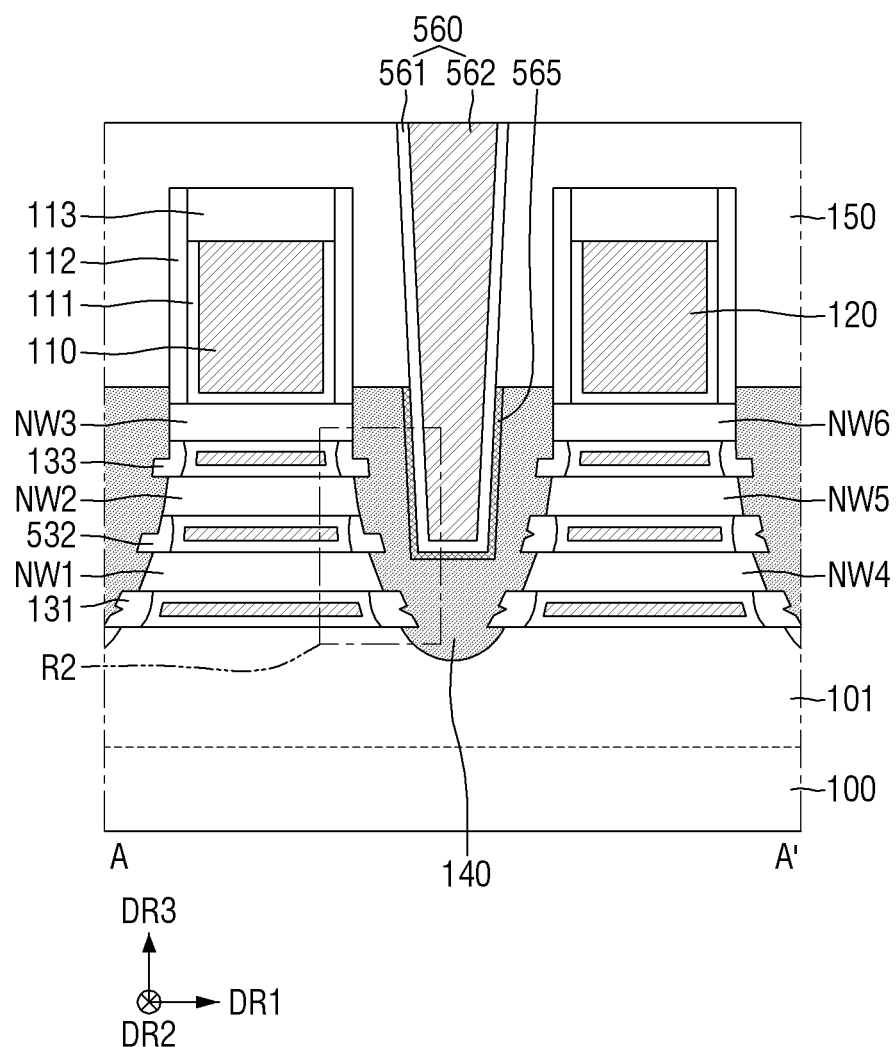
FIG. 17 is a cross-sectional view of a semiconductor device according to some other embodiments.

FIG. 17 is a cross-sectional view of a semiconductor device according to some other embodiments of the present disclosure. FIG. 18 is an enlarged view of region R2 of FIG. 17.

Figure 18:
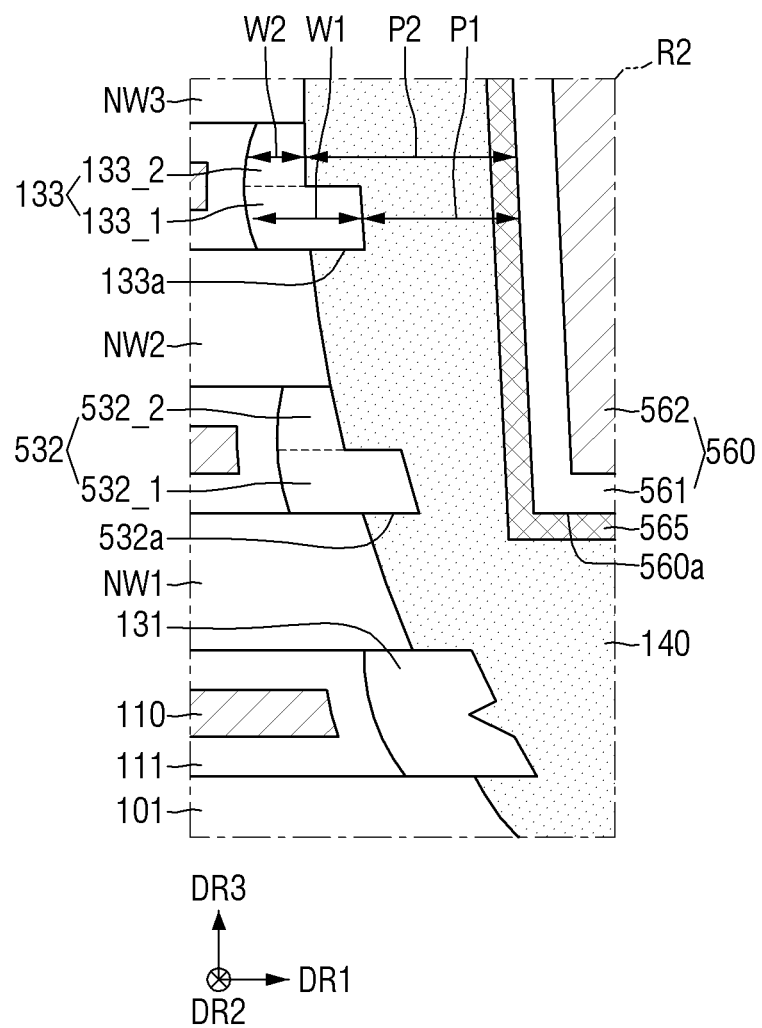
FIG. 18 is an enlarged view of region R2 of FIG. 17.

Referring to FIGS. 17 and 18, in the semiconductor device according to some other embodiment of the disclosure, a source/drain contact 560 may extend to a depth at which a second inner spacer 532 is disposed. That is, the source/drain contact 560 may overlap the second inner spacer 532 in the first direction DR1. For example, a lower surface 560a of the source/drain contact 560 may be formed on the same plane as a lower surface 532a of the second inner spacer 532. The source/drain contact 560 may include a source/drain contact barrier film 561 and a source/drain contact filling film 562. A silicide film 565 may be disposed between the source/drain region 140 and the source/drain contact 560.

The second inner spacer 532 may include a first portion 532_1, and a second portion 532_2 disposed on an upper surface of the first portion 532_1. The first portion 532_1 of the second inner spacer 532 may further protrude toward the source/drain region 140 beyond the second portion 532_2 of the second inner spacer 532. The second portion 532_2 of the second inner spacer 532 may be disposed between the first nanosheet NW1 and the second nanosheet NW2. At least a part of the first portion 532_1 of the second inner spacer 532 may extend into the source/drain region 140.

At least a part of the first portion 532_1 of the second inner spacer 532 that extends into the source/drain region 140 does not overlap the second portion 532_2 of the second inner spacer 532 in the vertical direction DR3. The side walls of the second portion 532_2 of the second inner spacer 532 may have a continuous slope profile with the side walls of the second nanosheet NW2. A width of the first portion 532_1 of the second inner spacer 532 in the first direction DRI may be greater than a width of the second portion 532_2 of the second inner spacer 532 in the first direction DR1.

Hereinafter, a semiconductor device according to some other embodiments of the present disclosure will be described referring to FIGS. 19 and 20. Differences relative to the semiconductor device shown in FIGS. 1 to 4 will be mainly described.

Figure 19:
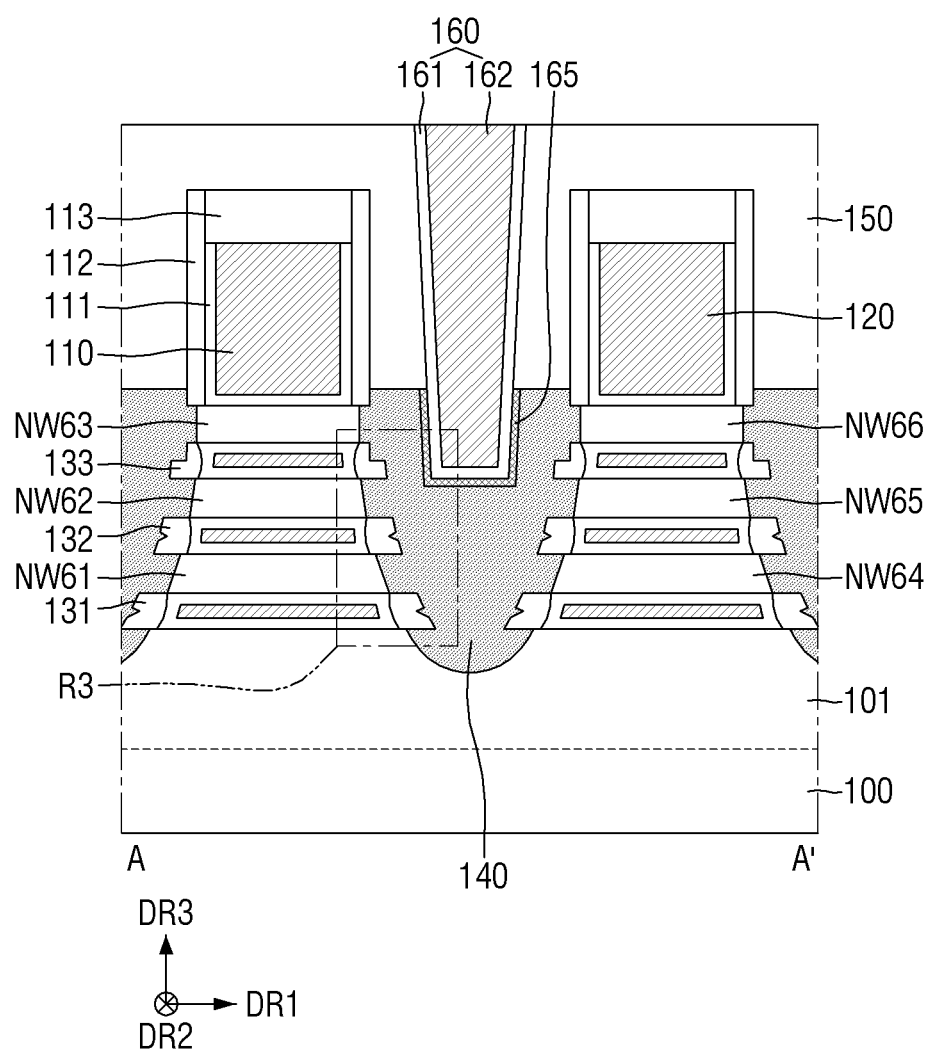
FIG. 19 is a cross-sectional view of a semiconductor device according to some other embodiments.

FIG. 19 is a cross-sectional view of a semiconductor device according to some other embodiments of the present disclosure. FIG. 20 is an enlarged view of region R3 of FIG. 19.

Figure 20:
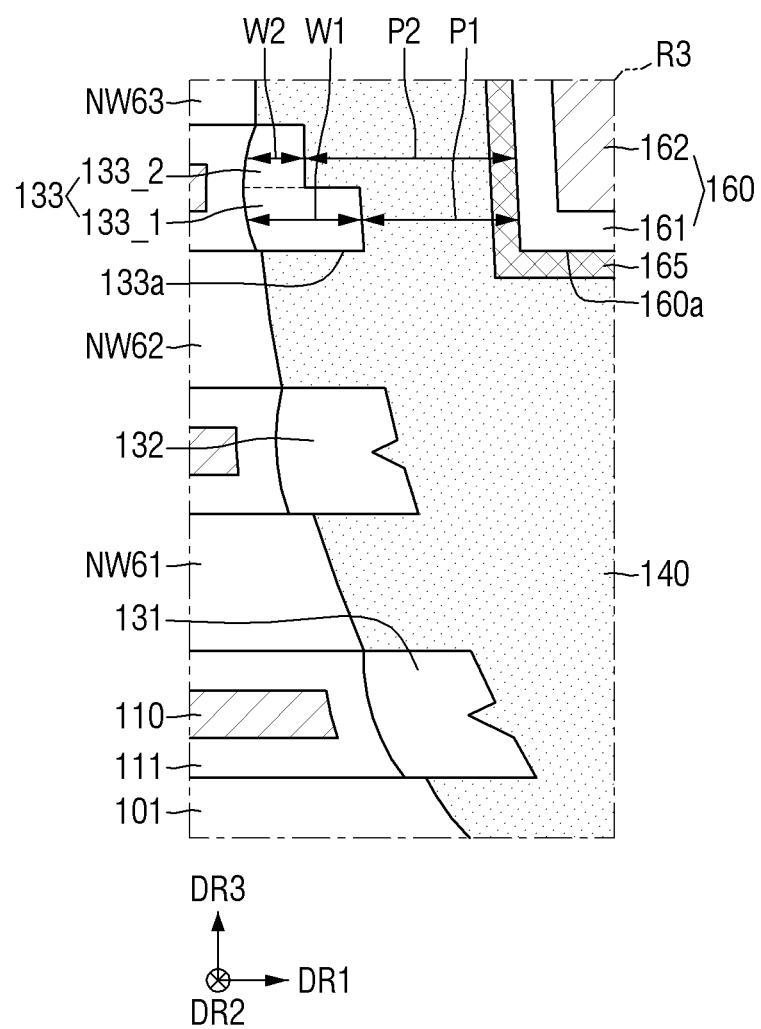
FIG. 20 is an enlarged view of region R3 of FIG. 19.

Referring to FIGS. 19 and 20, in the semiconductor device according to some other embodiments of the present disclosure, side walls of a third nanosheet NW63 may be retracted toward the first gate electrode 110 further than side walls of the second portion 133_2 of the third inner spacer 133. Further, side walls of a sixth nanosheet NW66 may be retracted toward the second gate electrode 120 further than the side walls of the second portion 133_2 of the third inner spacer 133.

At least a part of the upper surface of the second portion 133_2 of the third inner spacer 133 may be exposed on each of the side walls of the third nanosheet NW63 and the side walls of the sixth nanosheet NW66. For example, the upper surface of the second portion 133_2 of the third inner spacer 133 may be completely exposed on each of the side walls of the third nanosheet NW63 and the side walls of the sixth nanosheet NW66.

In some embodiments, the upper surface of the first inner spacer 131 may be completely exposed on each of the side walls of the first nanosheet NW61 and the side walls of the fourth nanosheet NW64. Also, the upper surface of the second inner spacer 132 may be completely exposed on each of the side walls of the second nanosheet NW62 and the side walls of the fifth nanosheet NW65.

Hereinafter, a semiconductor device according to some other embodiments of the present disclosure will be described referring to FIG. 21. Differences relative to the semiconductor device shown in FIGS. 19 and 20 will be mainly described.

Figure 21:
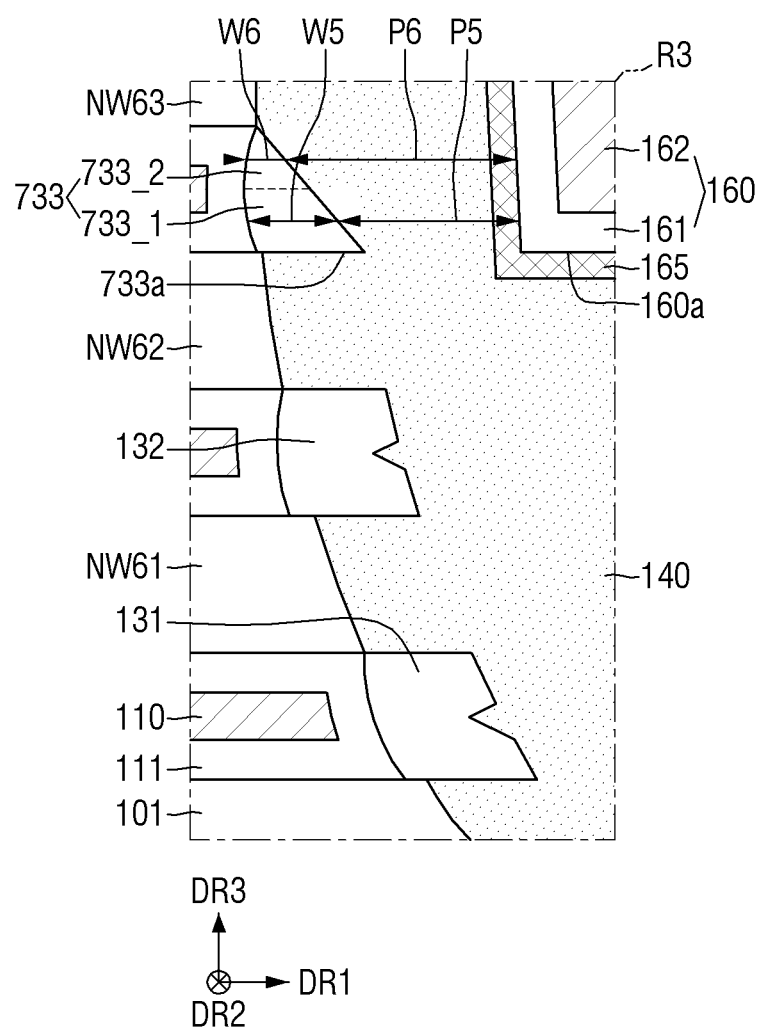
FIG. 21 is an enlarged view of a semiconductor device according to some other embodiments.

FIG. 21 is an enlarged view of a semiconductor device according to some other embodiments of the present disclosure. FIG. 21 corresponds to the view of FIG. 20.

Referring to FIG. 21, in a semiconductor device according to some other embodiment of the present disclosure, side walls of a first portion 733_1 of a third inner spacer 733 and side walls of a second portion 733_2 of the third inner spacer 733 may have a continuous slope profile. A part 733a of a lower surface of the first portion 733_1 of the third inner spacer 733 may be in contact with the second nanosheet NW62.

A width W5 of the first portion 733_1 of the third inner spacer 733 in the first direction DR1 may be greater than a width W6 of the second portion 733_2 of the third inner spacer 733 in the first direction DR1. A fifth pitch P5 in the first direction DR1 between the first portion 733_1 of the third inner spacer 733 and the source/drain contact 160 may be smaller than a sixth pitch P6 in the first direction DR1 between the second portion 733_2 of the third inner spacer 733 and the source/drain contact 160.

Hereinafter, a semiconductor device according to some other embodiments of the present disclosure will be described referring to FIGS. 22 and 23. Differences relative to the semiconductor devices shown in FIGS. 1 to 4 will be mainly described.

Figure 22:
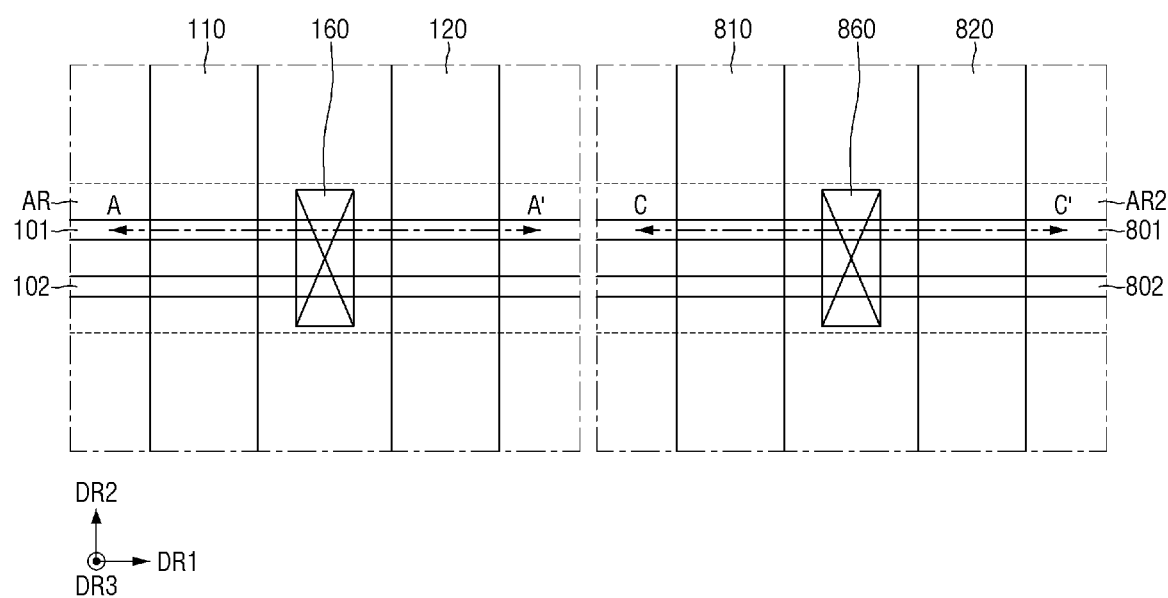
FIG. 22 is a layout diagram of a semiconductor device according to some other embodiments.

FIG. 22 is a layout diagram of a semiconductor device according to some other embodiments of the present disclosure. FIG. 23 is a cross-sectional view along lines A-A' and C-C' of FIG. 22.

Figure 23:
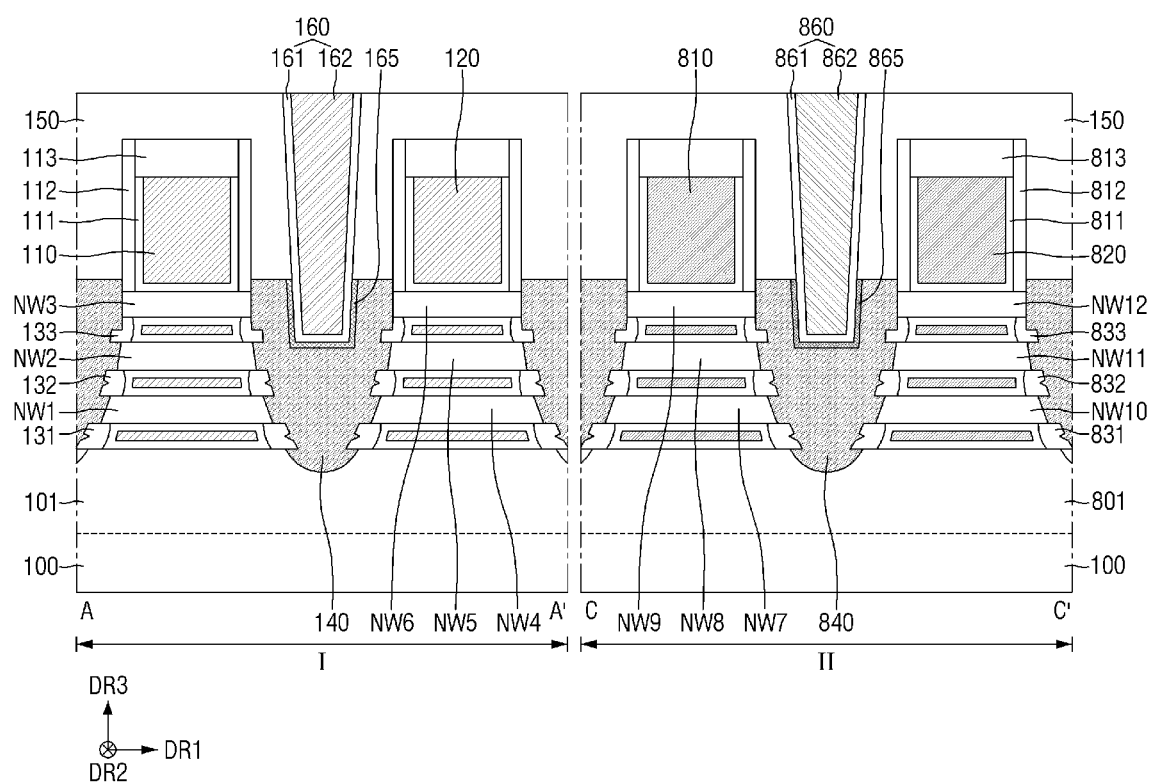
FIG. 23 is a cross-sectional view along line A-A' and line C-C' of FIG. 22.

Referring to FIGS. 22 and 23, in a semiconductor device according to some other embodiment of the present disclosure, an NMOS region I and a PMOS region II may be defined on the substrate 100. The NMOS region I may be the same as that of the semiconductor device shown in FIGS. 1 to 4. Therefore, a detailed description of the NMOS region I will not be provided.

The PMOS region II may include a second active region AR2, a third active pattern 801, a fourth active pattern 802, seventh to twelfth nanosheets NW7, NWB, NW9, NW10, NW11, and NW12, a third gate electrode 810, a second gate insulating film 811, a second outer spacer 812, a second capping pattern 813, a fourth gate electrode 820, fourth to sixth inner spacers 831, 832, and 833, a second source/drain region 840, a second source/drain contact 860, and a second silicide film 865. The second source/drain contact 860 may include a second source/drain contact barrier film 861 and a second source/drain contact filling film 862.

The PMOS region II may have the same structure as that of the NMOS region I. For example, each of the second active region AR2, the third active pattern 801, the fourth active pattern 802, the seventh to twelfth nanosheets NW7, NW8, NW9, NW10, NW11, and NW12, the third gate electrode 810, the second gate insulating film 811, the second outer spacer 812, the second capping pattern 813, the fourth gate electrode 820, the fourth to sixth inner spacers 831, 832, and 833, the second source/drain region 840, the second source/drain contact 860, and second silicide film 865 may include the same structures as those of each of the active region AR, the first active pattern 101, the second active pattern 102, the first to sixth nanosheets NW1, NW2, and NW3, NW4, NW5, and NW6, the first gate electrode 110, the gate insulating film 111, the outer spacer 112, the capping pattern 113, the second gate electrode 120, the first to third inner spacers 131, 132, and 133, the source/drain region 140, the source/drain contact 160, and the silicide film 165. In the semiconductor device according to some other embodiments of the present disclosure, each of an uppermost inner spacer 133 disposed in the NMOS region I and an uppermost inner spacer 833 disposed in the PMOS region II may have an L-shape.

Hereinafter, a semiconductor device according to some other embodiments of the present disclosure will be described referring to FIG. 24. Differences relative to the semiconductor devices shown in FIGS. 22 and 23 will be mainly described.

Figure 24:
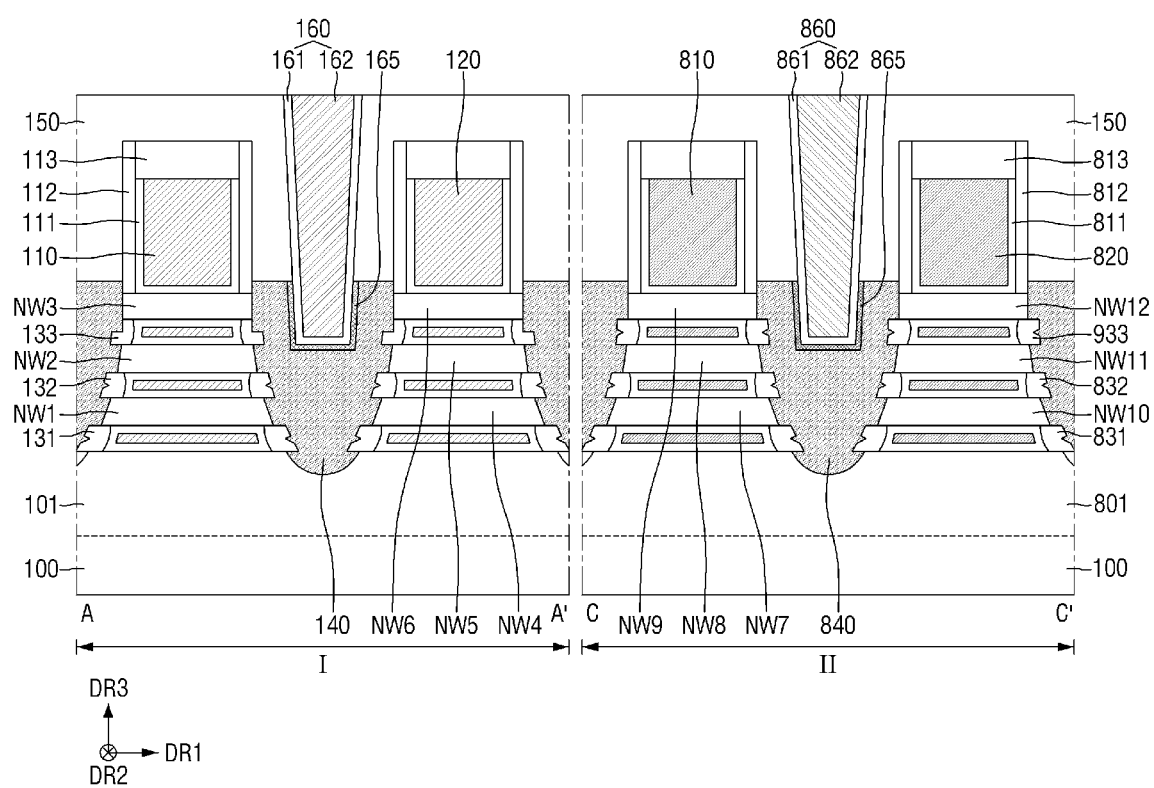
FIG. 24 is a cross-sectional view of a semiconductor device according to some other embodiments.

FIG. 24 is a cross-sectional view of a semiconductor device according to some other embodiments of the present disclosure. FIG. 24 corresponds to the view of FIG. 23.

Referring to FIG. 24, in a semiconductor device according to some other embodiments of the present disclosure, an uppermost inner spacer 933 disposed in the PMOS region II may not have an L-shape. For example, the uppermost inner spacer 933 may include a first portion disposed adjacent to the eighth nanosheet NW8, and a second portion disposed adjacent to the ninth nanosheet NW9. A width of the first portion of the sixth inner spacer 933 in the first direction DR1 may be formed to be the same as a width of the second portion of the sixth inner spacer 933 in the first direction DR1.

Hereinafter, a semiconductor device according to some other embodiments of the present disclosure will be described referring to FIG. 25. Differences relative to the semiconductor devices shown in FIGS. 22 and 23 will be mainly described.

Figure 25:
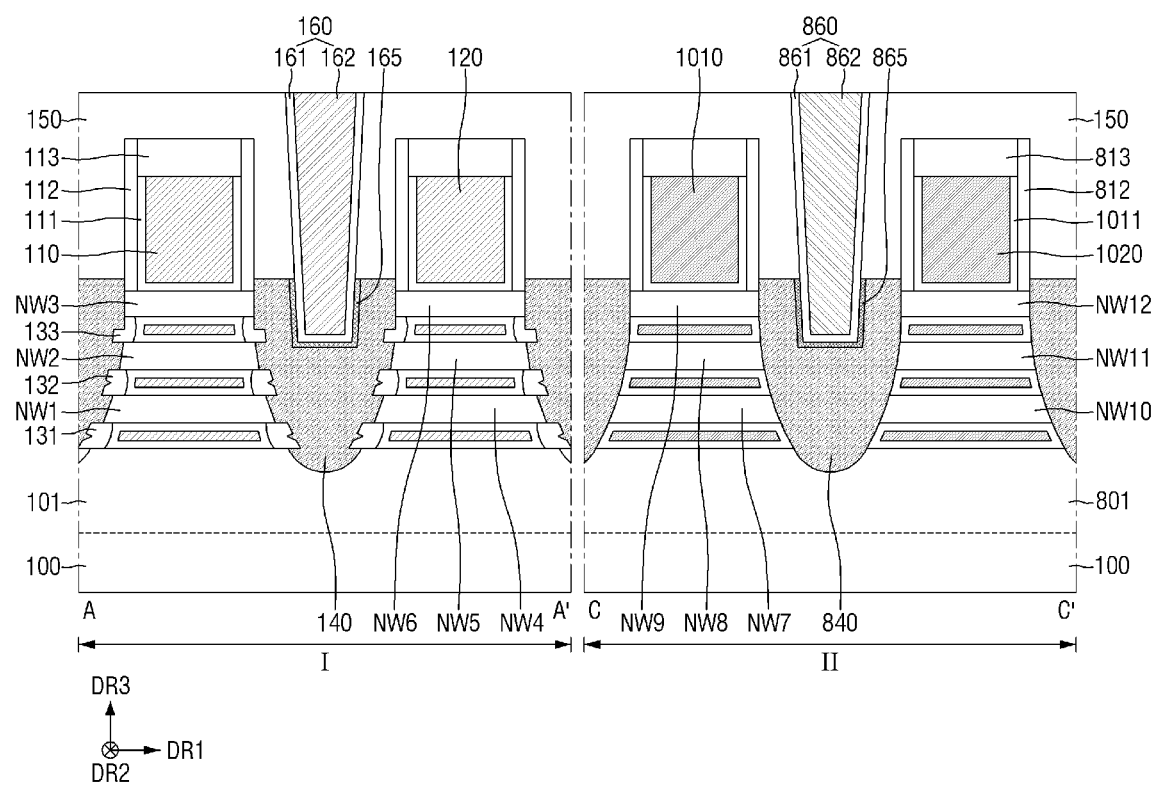
FIG. 25 is a cross-sectional view of a semiconductor device according to some other embodiments.

FIG. 25 is a cross-sectional view of a semiconductor device according to some other embodiments of the present disclosure. FIG. 25 corresponds to the view of FIG. 23.

Referring to FIG. 25, the semiconductor device according to some other embodiment of the present disclosure does not have an inner spacer disposed in the PMOS region II. For example, a second gate insulating film 1011 disposed between a third gate electrode 1010 and a second source/drain region 840 may be in contact with a second source/drain region 840. Further, the second gate insulating film 1011 disposed between a fourth gate electrode 1020 and the second source/drain region 840 may be in contact with the second source/drain region 840.

By way of summation and review, aspects of the present disclosure provide a semiconductor device in which a width of a lower part of an inner spacer adjacent to a source/drain contact is formed to be greater than a width of an upper part, e.g., to have an L-shape, to increase an interval between the inner spacer and the source/drain contact and improve reliability. Aspects of the present disclosure also provide a semiconductor device in which only a width of an upper part is reduced in a state of maintaining a width of a lower part of an inner spacer disposed adjacent to a source/drain contact to prevent an occurrence of deterioration between the gate electrode and the source/drain region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate;
    an active pattern extending in a first direction on the substrate;
    first and second nanosheets stacked on the active pattern to be spaced apart from each other in a vertical direction;
    a gate electrode that extends in a second direction different from the first direction on the active pattern, the gate electrode surrounding each of the first and second nanosheets;
    a source/drain region on at least one side of the gate electrode; and
    inner spacers between the gate electrode and the source/drain region, the inner spacers including:
        a first inner spacer between the active pattern and the first nanosheet, and
        a second inner spacer between the first nanosheet and the second nanosheet, the second inner spacer having:
            a first portion adjacent to the first nanosheet, and
            a second portion adjacent to the second nanosheet, a width of the first portion of the second inner spacer in the first direction being greater than a width of the second portion of the second inner spacer in the first direction,
    wherein at least a part of the first portion of the second inner spacer extends farther into the source/drain region than the second portion of the second inner spacer.

2. The semiconductor device as claimed in claim 1, further comprising a source/drain contact on the source/drain region and extending into the source/drain region, a first pitch in the first direction between the first portion of the second inner spacer and the source/drain contact being smaller than a second pitch in the first direction between the second portion of the second inner spacer and the source/drain contact.

3. The semiconductor device as claimed in claim 2, wherein a lower surface of the source/drain contact is on a same plane as a lower surface of the second inner spacer.

4. The semiconductor device as claimed in claim 2, wherein a lower surface of the source/drain contact is on a same plane as a lower surface of the first inner spacer.

5. The semiconductor device as claimed in claim 1, wherein the second portion of the second inner spacer is between the first nanosheet and the second nanosheet.

6. The semiconductor device as claimed in claim 1, wherein the at least part of the first portion of the second inner spacer that extends into the source/drain region does not overlap the second portion of the second inner spacer in the vertical direction.

7. The semiconductor device as claimed in claim 1, wherein at least a part of the first inner spacer extends into the source/drain region.

8. The semiconductor device as claimed in claim 1, wherein a side wall of the second portion of the second inner spacer has a continuous slope profile with a side wall of the second nanosheet.

9. The semiconductor device as claimed in claim 1, wherein:
    the first inner spacer includes a first portion adjacent to the active pattern, and a second portion adjacent to the first nanosheet, and
    a width of the first portion of the first inner spacer in the first direction is greater than a width of the second portion of the first inner spacer in the first direction.

10. The semiconductor device as claimed in claim 1, wherein:
    each of the at least a part of the first portion of the second inner spacer and at least a part of the second portion of the second inner spacer extends into the source/drain region, and
    a side wall of the second portion of the second inner spacer has a continuous slope profile with a side wall of the first portion of the second inner spacer.

11. The semiconductor device as claimed in claim 1, wherein a side wall of the second nanosheet is recessed toward the gate electrode further than a side wall of the second portion of the second inner spacer.

12. A semiconductor device, comprising:
    a substrate;
    an active pattern extending in a first direction on the substrate;
    nanosheets stacked on the active pattern to be spaced apart from each other in a vertical direction;
    a gate electrode in a second direction different from the first direction on the active pattern, the gate electrode surrounding each of the nanosheets;
    a source/drain region on at least one side of the gate electrode;

inner spacers between the gate electrode and the source/drain region, the inner spacers extending into the source/drain region; and a source/drain contact on the source/drain region, the source/drain contact extending into the source/drain region and overlapping an uppermost one of the inner spacers in the first direction, the uppermost one of the inner spacers including:

a first portion, and a second portion on an upper surface of the first portion, a first pitch in the first direction between the first portion and the source/drain contact being smaller than a second pitch in the first direction between the second portion and the source/drain contact.

13. The semiconductor device as claimed in claim 12, wherein a width of the first portion of the uppermost one of the inner spacers in the first direction is greater than a width of the second portion of the uppermost one of the inner spacers in the first direction.

14. The semiconductor device as claimed in claim 12, wherein at least a part of the first portion of the uppermost one of the inner spacers extending into the source/drain region does not overlap the second portion of the uppermost one of the inner spacers in the vertical direction.

15. The semiconductor device as claimed in claim 12, wherein a side wall of the second portion of the uppermost one of the inner spacers has a continuous slope profile with a side wall of an uppermost one of the nanosheets.

16. The semiconductor device as claimed in claim 12, wherein a lower surface of the source/drain contact is on a same plane as a lower surface of the uppermost one of the inner spacers.

17. A semiconductor device, comprising:

a substrate including a NMOS region and a PMOS region;

first nanosheets extending in a first direction on the NMOS region of the substrate, the first nanosheets being stacked to be spaced apart from each other in a vertical direction;

second nanosheets extending in the first direction on the PMOS region of the substrate, the second nanosheets being stacked to be spaced apart from each other in the vertical direction;

a first gate electrode extending on the NMOS region of the substrate in a second direction different from the first direction, the first gate electrode surrounding each of the first nanosheets;

a second gate electrode extends on the PMOS region of the substrate in the second direction, the second gate electrode surrounding each of the second nanosheets;

a first source/drain region on at least one side of the first gate electrode;

a second source/drain region on at least one side of the second gate electrode; and first inner spacers between the first gate electrode and the first source/drain region, the first inner spacers extending into the first source/drain region, and an uppermost one of the first inner spacers having:

a first portion, and a second portion on an upper surface of the first portion, a width of the first portion in the first direction being greater than a width of the second portion in the first direction, wherein the first portion extends farther toward the first source/drain region than the second portion.

18. The semiconductor device as claimed in claim 17, further comprising second inner spacers between the second gate electrode and the second source/drain region, the second inner spacers extending into the second source/drain region.

19. The semiconductor device as claimed in claim 18, wherein an uppermost one of the second inner spacers includes:

a third portion; and a fourth portion on an upper surface of the third portion, a width of the third portion in the first direction being greater than a width of the fourth portion in the first direction.

20. The semiconductor device as claimed in claim 17, further comprising a gate insulating film between the second gate electrode and the second source/drain region, the gate insulating film being in contact with the second source/drain region.

* * * * *